(12) United States Patent
Carson et al.

(10) Patent No.: US 10,535,611 B2
(45) Date of Patent: Jan. 14, 2020

(54) SUBSTRATE-LESS INTEGRATED COMPONENTS

(71) Applicant: Apple Inc., Cupertino, CA (US)

(72) Inventors: Flynn P. Carson, Redwood City, CA (US); Jun Chung Hsu, Cupertino, CA (US); Meng Chi Lee, Los Altos, CA (US); Shakti S. Chauhan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 511 days.

(21) Appl. No.: 15/042,817

(22) Filed: Feb. 12, 2016

(65) Prior Publication Data

US 2017/0148744 A1 May 25, 2017

Related U.S. Application Data

(60) Provisional application No. 62/258,387, filed on Nov. 20, 2015.

(51) Int. Cl.
| | |
|---|---|
| *H01L 23/552* | (2006.01) |
| *H01L 23/31* | (2006.01) |
| *H01L 23/498* | (2006.01) |
| *H01L 21/48* | (2006.01) |
| *H01L 21/56* | (2006.01) |
| *H01L 21/78* | (2006.01) |
| *H01L 23/00* | (2006.01) |

(52) U.S. Cl.
CPC .......... *H01L 23/552* (2013.01); *H01L 21/485* (2013.01); *H01L 21/4853* (2013.01); *H01L 21/78* (2013.01); *H01L 23/49811* (2013.01); *H01L 23/49838* (2013.01); *H01L 21/568* (2013.01); *H01L 24/92* (2013.01); *H01L 24/96* (2013.01); *H01L 24/97* (2013.01); *H01L 2224/12105* (2013.01)

(58) Field of Classification Search
CPC . H01L 21/568; H01L 21/78; H01L 23/49805; H01L 23/49811; H01L 24/92; H01L 24/94; H01L 24/96; H01L 24/97; H01L 24/98; H01L 2224/12105; H01L 2224/81005; H01L 21/7806; H01L 21/6835; H01L 21/485; H01L 21/4853; H01L 23/552; H01L 23/49838
See application file for complete search history.

(56) References Cited

U.S. PATENT DOCUMENTS 5,859,475 A * 1/1999 Freyman ............ H01L 23/3128
257/688
6,664,615 B1 * 12/2003 Bayan ................ H01L 23/3128
257/666

(Continued)

*Primary Examiner* — Mary A Wilczewski
(74) *Attorney, Agent, or Firm* — Jaffery Watson Mendonsa & Hamilton LLP

(57) ABSTRACT

Packages including substrate-less integrated components and methods of fabrication are described are described. In an embodiment, a packaging method includes attaching a ground structure to a carrier and a plurality of components face down to the carrier and laterally adjacent to the ground structure. The plurality of components are encapsulated within a molding compound, and the carrier is removed exposing a plurality of component terminals and a plurality of ground structure terminals. A plurality of packages are singulated.

18 Claims, 17 Drawing Sheets

(56) References Cited

U.S. PATENT DOCUMENTS

| | | | |
|---|---|---|---|
| 7,763,976 B2 | 7/2010 | Tang et al. | |
| 7,842,546 B2 | 11/2010 | Tang | |
| 8,093,691 B1* | 1/2012 | Fuentes | H01L 23/3128 |
| | | | 257/659 |
| 8,268,677 B1* | 9/2012 | Pagaila | H01L 23/147 |
| | | | 438/127 |
| 8,617,927 B1* | 12/2013 | Margomenos | H01L 23/3677 |
| | | | 438/112 |
| 8,674,500 B2* | 3/2014 | Pendse | H01L 21/563 |
| | | | 257/734 |
| 8,772,913 B1* | 7/2014 | Muniandy | H01L 23/367 |
| | | | 257/675 |
| 8,945,989 B2 | 2/2015 | Muniandy et al. | |
| 9,257,393 B1* | 2/2016 | Gong | H01L 23/3114 |
| 9,269,673 B1* | 2/2016 | Lin | H01L 24/97 |
| 9,318,411 B2* | 4/2016 | Lin | H01L 24/97 |
| 9,362,196 B2* | 6/2016 | Yamada | H01L 23/3128 |
| 9,462,196 B1* | 10/2016 | Hundemer | H04N 5/268 |
| 9,490,221 B2* | 11/2016 | Arai | H01L 23/552 |
| 9,607,918 B2* | 3/2017 | Gong | H01L 23/3114 |
| 9,673,150 B2* | 6/2017 | Gong | H01L 24/97 |
| 9,761,570 B1* | 9/2017 | Vincent | H01L 23/49861 |
| 9,826,630 B2* | 11/2017 | Vincent | H05K 1/0298 |
| 9,831,170 B2* | 11/2017 | Scanlan | H01L 23/49838 |
| 9,953,932 B2* | 4/2018 | Kawabata | H01L 24/97 |
| 9,960,328 B2* | 5/2018 | Clark | H01L 33/44 |
| 10,037,949 B1* | 7/2018 | Kim | H01L 24/97 |
| 10,044,175 B1* | 8/2018 | Sloat | H02B 1/26 |
| 10,049,961 B1* | 8/2018 | Qi | H01L 23/4334 |
| 10,074,614 B2* | 9/2018 | Gong | H01L 24/97 |
| 2006/0065972 A1* | 3/2006 | Khan | H01L 23/13 |
| | | | 257/712 |
| 2007/0249153 A1* | 10/2007 | Dong | H01L 21/76898 |
| | | | 438/597 |
| 2008/0185692 A1* | 8/2008 | Salzman | H01L 23/552 |
| | | | 257/659 |
| 2008/0230898 A1* | 9/2008 | Meguro | H01L 21/561 |
| | | | 257/737 |
| 2010/0140779 A1* | 6/2010 | Lin | H01L 23/49816 |
| | | | 257/690 |
| 2010/0301474 A1* | 12/2010 | Yang | H01L 21/6835 |
| | | | 257/737 |
| 2010/0327465 A1* | 12/2010 | Shen | H01L 21/563 |
| | | | 257/778 |
| 2011/0147911 A1* | 6/2011 | Kohl | H01L 21/6835 |
| | | | 257/686 |
| 2011/0151623 A1* | 6/2011 | Takahashi | H01L 21/56 |
| | | | 438/110 |
| 2011/0304015 A1* | 12/2011 | Kim | H01L 23/552 |
| | | | 257/532 |
| 2012/0241955 A1* | 9/2012 | Law | H01L 24/81 |
| | | | 257/738 |
| 2013/0040426 A1* | 2/2013 | Narita | H01L 24/28 |
| | | | 438/113 |
| 2013/0337648 A1* | 12/2013 | Lin | H01L 21/486 |
| | | | 438/675 |
| 2014/0252573 A1 | 9/2014 | Lin et al. | |
| 2015/0029678 A1 | 1/2015 | Lu et al. | |
| 2015/0035127 A1* | 2/2015 | Yang | H01L 23/49838 |
| | | | 257/659 |
| 2015/0097277 A1* | 4/2015 | Chen | H01L 23/3135 |
| | | | 257/668 |
| 2015/0108661 A1* | 4/2015 | Vincent | H01L 24/30 |
| | | | 257/777 |
| 2015/0115433 A1* | 4/2015 | Lin | H01L 23/3675 |
| | | | 257/712 |
| 2015/0130046 A1* | 5/2015 | Lin | H01L 24/97 |
| | | | 257/712 |
| 2015/0187710 A1* | 7/2015 | Scanlan | H01L 24/05 |
| | | | 257/777 |
| 2016/0005726 A1* | 1/2016 | Chen | H01L 23/3135 |
| | | | 257/737 |
| 2016/0093580 A1* | 3/2016 | Scanlan | H01L 23/48 |
| | | | 257/737 |
| 2016/0118313 A1* | 4/2016 | Gong | H01L 23/3114 |
| | | | 257/773 |
| 2016/0172309 A1* | 6/2016 | Gong | H01L 24/97 |
| | | | 257/659 |
| 2016/0351509 A1* | 12/2016 | Dang | H01L 23/552 |
| 2017/0077022 A1* | 3/2017 | Scanlan | H01L 23/49838 |
| 2017/0110413 A1* | 4/2017 | Chen | H01L 21/3205 |
| 2017/0148744 A1* | 5/2017 | Carson | H01L 23/552 |
| 2017/0162476 A1* | 6/2017 | Meyer | H01L 21/78 |
| 2017/0162516 A1* | 6/2017 | Joh | H01L 24/97 |
| 2017/0263572 A1* | 9/2017 | Gong | H01L 24/97 |
| 2018/0063948 A1* | 3/2018 | Vincent | H05K 1/0298 |
| 2018/0151507 A1* | 5/2018 | Chen | B81C 99/007 |
| 2018/0151540 A1* | 5/2018 | Yu | H01L 21/561 |
| 2018/0174865 A1* | 6/2018 | Yu | H01L 24/19 |
| 2019/0067163 A1* | 2/2019 | Qi | H01L 23/4334 |

* cited by examiner

| Parameter | Description |
|---|---|
| W | Ground Ring + Shield |
| D | Comp-to-Edge |
| S | Terminal-to-Ground |
| H2 | Ground Ring Height |
| H3 | Stand-Off |
| H4 | Comp-Bump |
| G | Comp-to-Top |
| M | Mold Thickness |

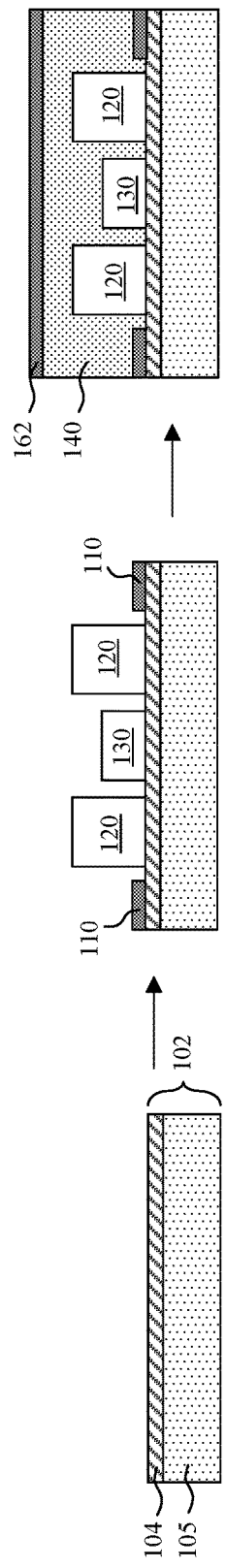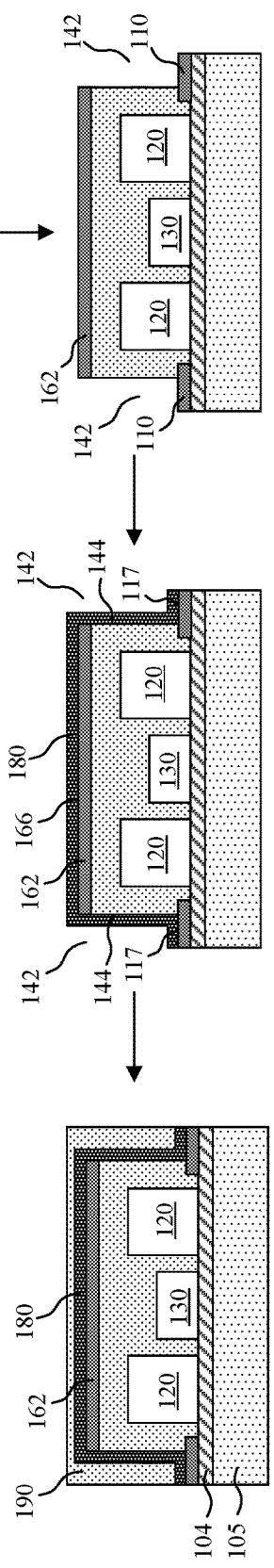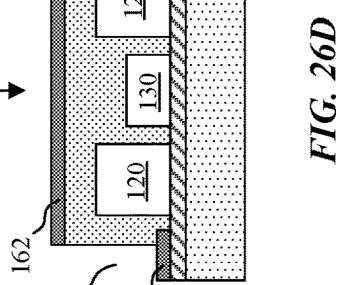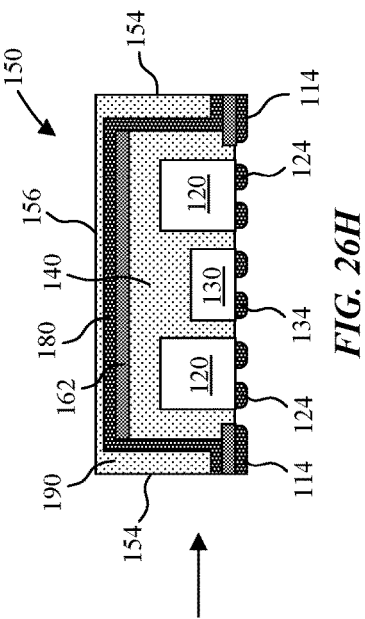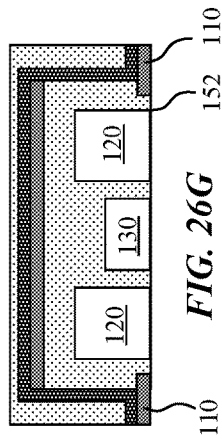

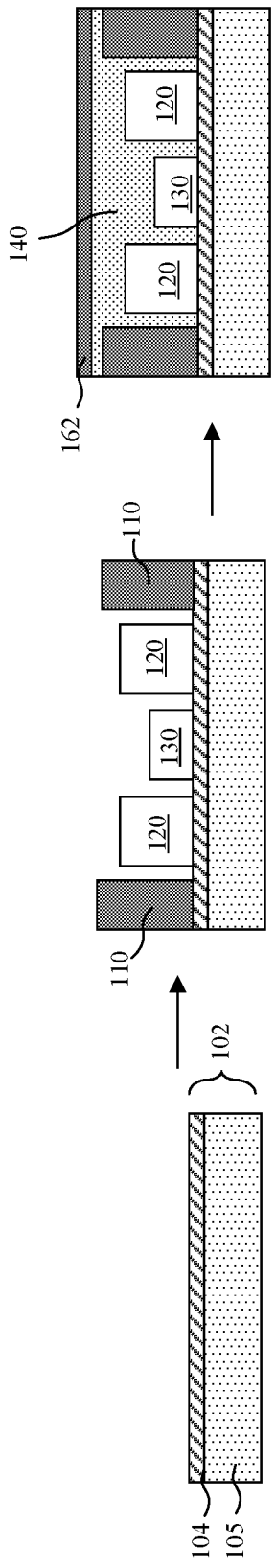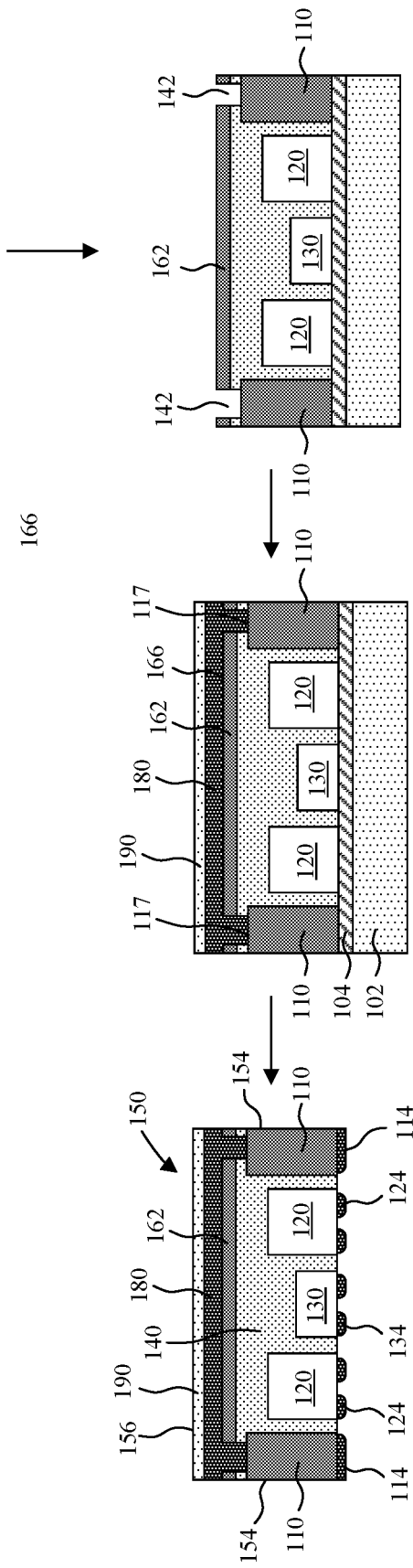

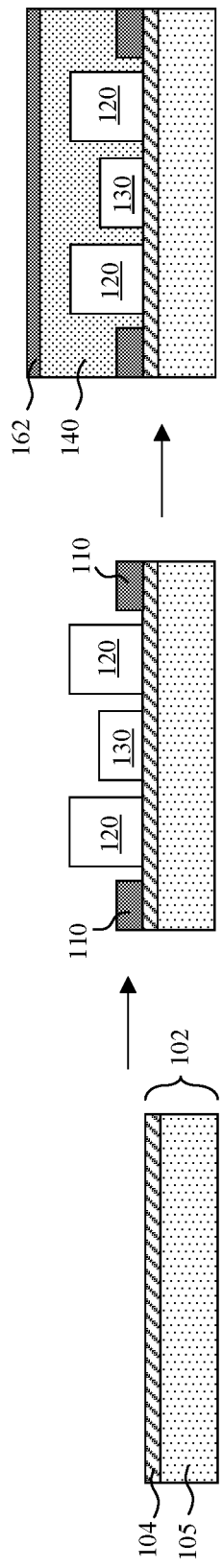
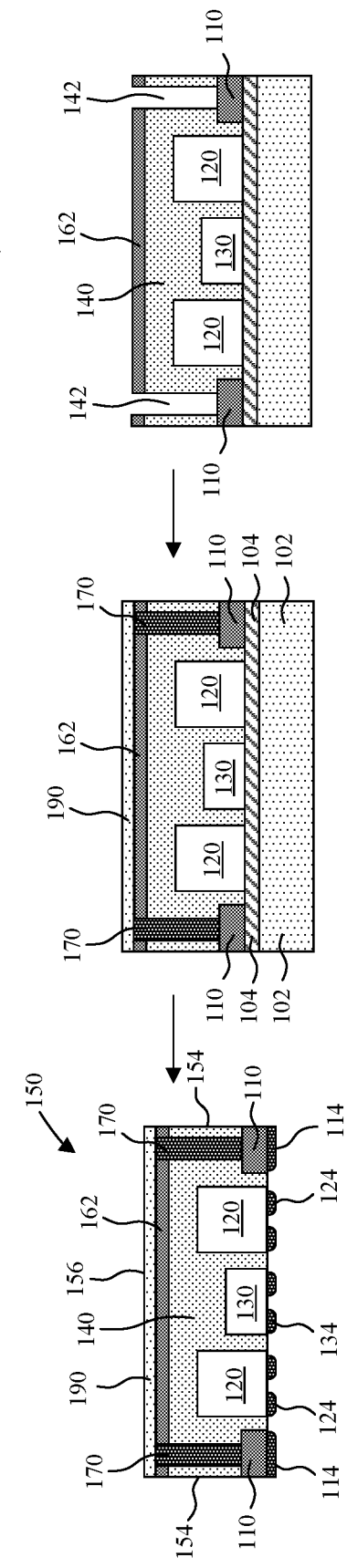
FIG. 28A
FIG. 28B
FIG. 28C
FIG. 28D
FIG. 28E
FIG. 28F

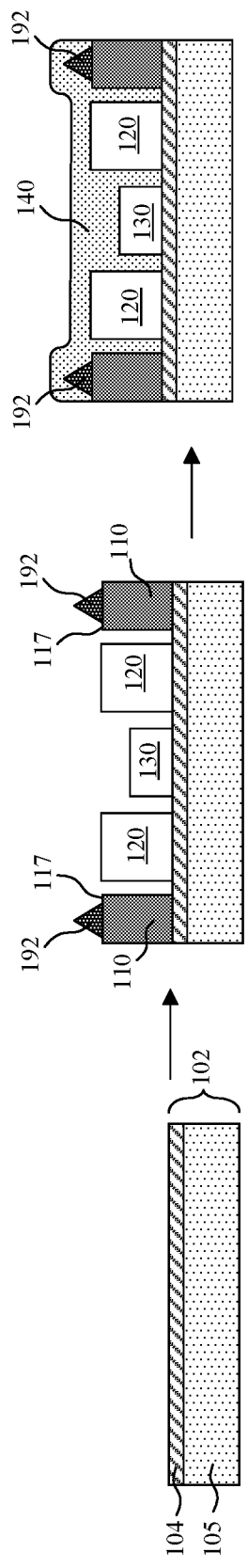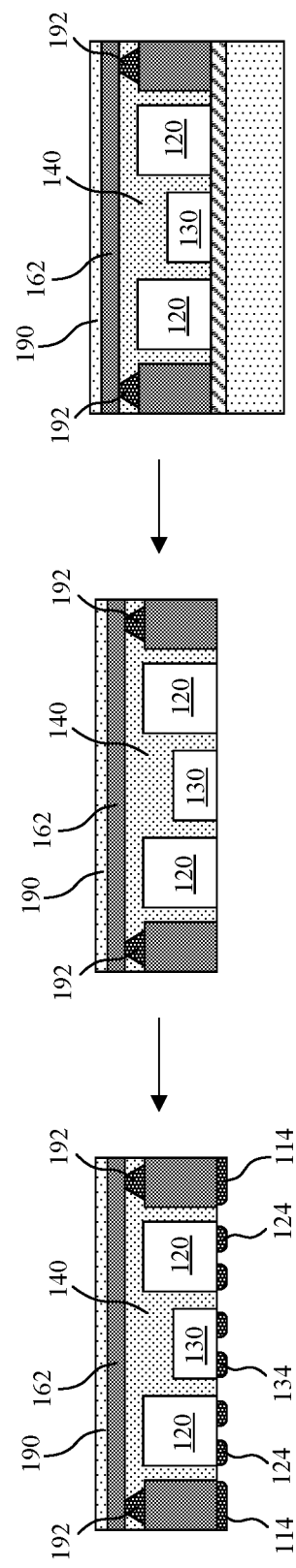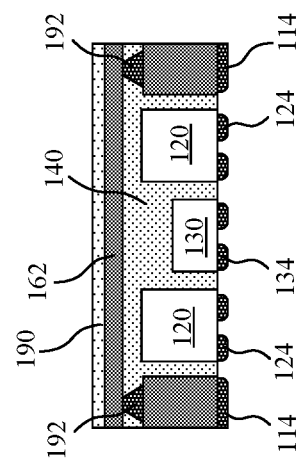

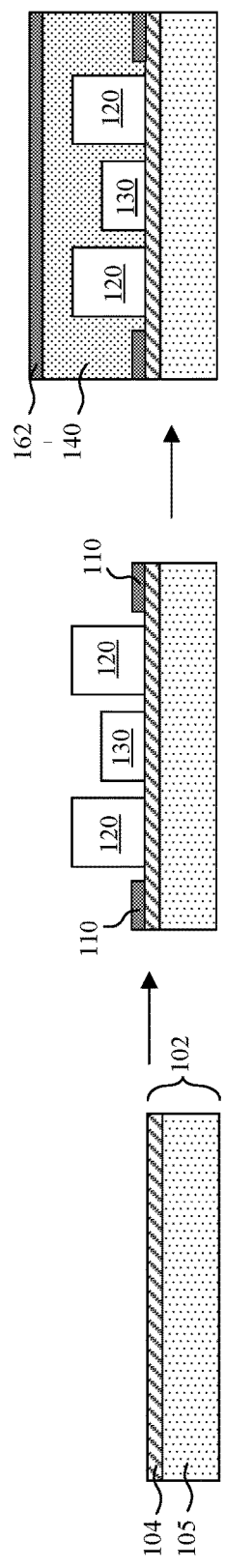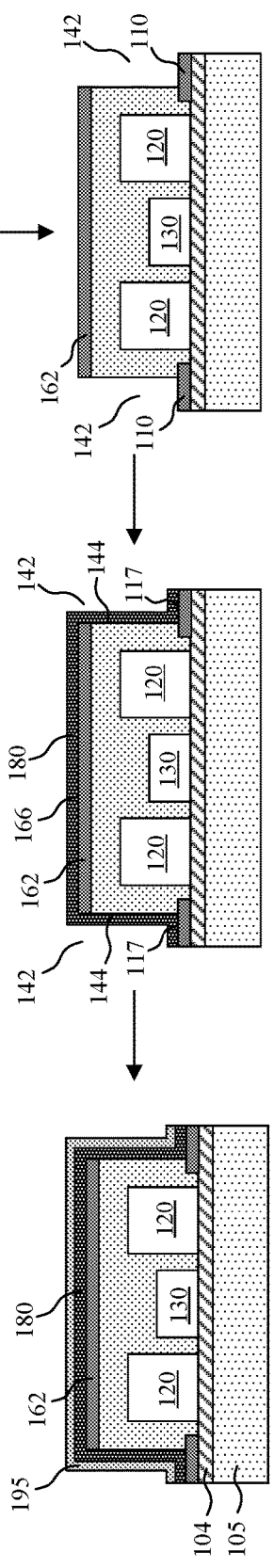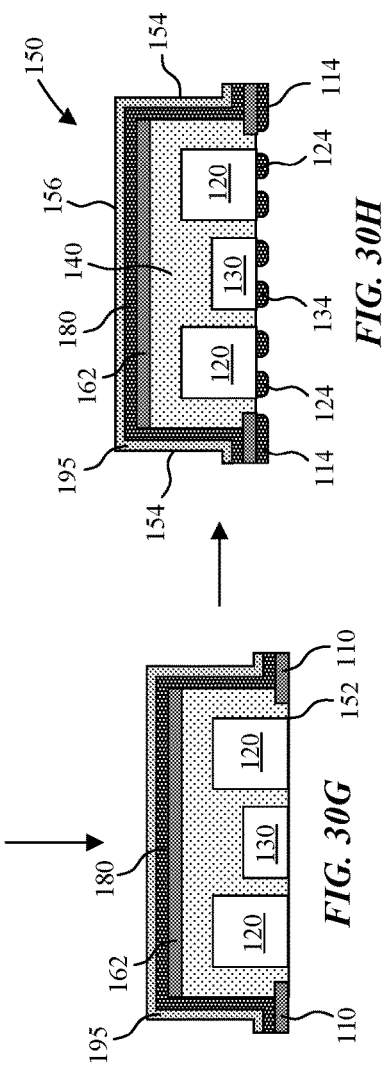

SUBSTRATE-LESS INTEGRATED COMPONENTS

CROSS-REFERENCE TO RELATED APPLICATIONS

This application claims the benefit of priority from U.S. Provisional Application No. 62/258,387, filed on Nov. 20, 2015, which is incorporated herein by reference.

BACKGROUND

Field

Embodiments described herein relate to electronic packaging. More particularly, embodiments relate to substrate-less packaging techniques.

Background Information

Plastic ball grid array (BGA) substrates are commonly used for memory, controller, and chipset applications amongst others. BGA substrates are commonly sold in the strip form, and characterized as rigid substrates that include a core, such as a resin layer reinforced with glass cloth, and build-up layers on opposite sides of the core. The build-up layers can be interconnected by through vias extending through the core layer. An exemplary core layer may have a thickness in the range of 50-800 µm. In response to the continued trend for higher density and lower profile (z-height) packages, for example, in mobile devices, recent packaging developments have investigated reduction of the core layer thickness as well as fabrication of coreless substrates.

A common BGA package assembly process may include using an off-the-shelf BGA substrate strip, mounting a plurality of die and components onto the BGA substrate strip, and encapsulating the plurality of die and components in a molding compound on the BGA substrate strip. A plurality of packages may then be singulated from the molded BGA substrate strip.

SUMMARY

Embodiments describe packaging methods and package structures including substrate-less integrated components, as well as integrated electromagnetic interference (EMI) shielding structures. In an embodiment, a packaging method includes attaching a ground structure to a carrier, attaching a plurality of components face down to the carrier and laterally adjacent to the ground structure, encapsulating the plurality of components within a molding compound, removing the carrier, exposing a plurality of component terminals and a plurality of ground structure terminals, and singulating a plurality of packages, with each package including a component encapsulated within the molding compound. Singulating the plurality of packages may include cutting through the ground structure. In accordance with embodiments, solder bumps can be applied to the exposed plurality of ground structure terminals after removal of the carrier. In some embodiments, singulation includes cutting through the ground structure and the solder bumps applied to the plurality of ground structure terminals.

In addition to components, die may also be attached die face down to the carrier and encapsulated within the molding compound. The ground structure may additionally be encapsulated within the molding compound. In an embodiment, a plurality of die terminals are exposed after removal of the carrier, and solder bumps are applied to the plurality of exposed die terminals prior to singulating the plurality of packages. Alternatively, die solder bumps are pre-applied, and they are exposed upon removal of the carrier.

One or more routing substrates may also be attached to the carrier in accordance with embodiments. In an embodiment a routing substrate is attached to the carrier, and the plurality of components are attached face down to the carrier within a plurality of openings in the routing substrate. In such an arrangement, the routing substrate may also include the ground structure. In accordance with embodiments, a plurality of routing substrate terminals and a plurality of ground structure terminals are exposed after removal of the carrier, and solder bumps are applied to the plurality of exposed routing substrate terminals and the plurality of ground structure terminals prior to singulating the plurality of packages. In other embodiments, a plurality of separate and discrete routing substrates are attached to the carrier, for example, within each separate package area.

In some embodiments, the packaging method includes depositing an EMI shield layer on top and side surfaces of the molding compound after singulating the plurality of packages. In other embodiments, EMI shielding structures can be fabricated prior to singulation, while still supported at the panel or substrate strip level.

In an embodiment, EMI shielding is fabricated with a thick ground structure. In an embodiment, a thickness of the molding compound is reduced to expose the ground structure prior to removing the carrier, and a top conductive layer is formed over the molding compound and directly on the ground structure prior to removing the carrier.

In some embodiments, EMI shielding is fabricated with trench and fill techniques. In an embodiment, a plurality of trenches are formed in the molding compound to expose the ground structure, and the trenches are at least partially filled with a conductive fill material prior to singulating the plurality of packages. Singulation may optionally include cutting through the conductive fill material. In an embodiment, at least partially filling the plurality of trenches with the conductive fill material includes electrolytic plating a metal cap layer within the plurality of trenches and over the molding compound. In an embodiment, at least partially filling the plurality of trenches with a conductive fill material includes filling the plurality of trenches with a conductive paste. In an embodiment, a top conductive layer is formed over the molding compound and directly on the conductive paste that fills the plurality of trenches prior to removing the carrier.

In an embodiment, a packaging includes a top surface, a bottom surface, and sidewalls. A component and a die encapsulated in a molding compound, and solder bumps are directly on component terminals along the bottom surface of the package. The package may additionally include a ground structure, and solder bumps directly on ground structure terminals along the bottom surface of the package. In accordance with embodiments, the ground structure may form a portion of the package sidewalls. The ground structure may additionally be encapsulated in the molding compound (for example, less the exposed sidewalls of the ground structure).

In an embodiment, the package additionally includes a routing substrate laterally adjacent to the component. Solder bumps can be directly on routing substrate terminals along the bottom surface of the package. The die may additionally be mounted on the routing substrate and encapsulated within the molding compound. In an embodiment, the component is encapsulated within the molding compound within an opening in the routing substrate, and the ground structure is within the routing substrate.

A variety of EMI shielding structures are disclosed. The package may include a top conductive layer on the molding compound and directly over the component and the die, and in electrical contact with the ground structure. In an embodiment, a metal cap layer spans along a top surface of the ground structure, sidewalls of the molding compound, and a top surface of the top conductive layer. A second metal cap layer may cover the first metal cap layer. The second metal cap layer may at least partially forms the sidewalls of the package. In an embodiment, a top passivation layer covers the first metal cap layer. The top passivation layer may at least partially forms the sidewalls of the package.

In one embodiment, the package includes a plurality of needle pins on the ground structure, where each of the needle pins extends through the molding compound and is in direct contact with the top conductive layer.

In an embodiment, a conductive fill material extends between the top conductive layer and the ground structure. In one embodiment, the top conductive layer is formed directly on a top surface of the conductive fill material. In one embodiment, a top surface of the conductive fill material is level with a top surface of the top conductive layer.

BRIEF DESCRIPTION OF THE DRAWINGS

FIGS. 26A-26H are schematic cross-sectional side view illustrations of method of forming insulated EMI shielding with trenches and conductive film formation in accordance with an embodiment.

FIGS. 27A-27F are schematic cross-sectional side view illustrations of method of forming insulated EMI shielding with a thick ground structure and shallow trenches in accordance with an embodiment.

FIGS. 28A-28F are schematic cross-sectional side view illustrations of method of forming insulated EMI shielding with filled trenches in accordance with an embodiment.

FIGS. 29A-29F are schematic cross-sectional side view illustrations of method of forming EMI shielding with needle pins in accordance with an embodiment.

FIGS. 30A-30H are schematic cross-sectional side view illustrations of method of forming insulated EMI shielding with trenches and conductive film formation in accordance with an embodiment.

DETAILED DESCRIPTION

Figure 1:
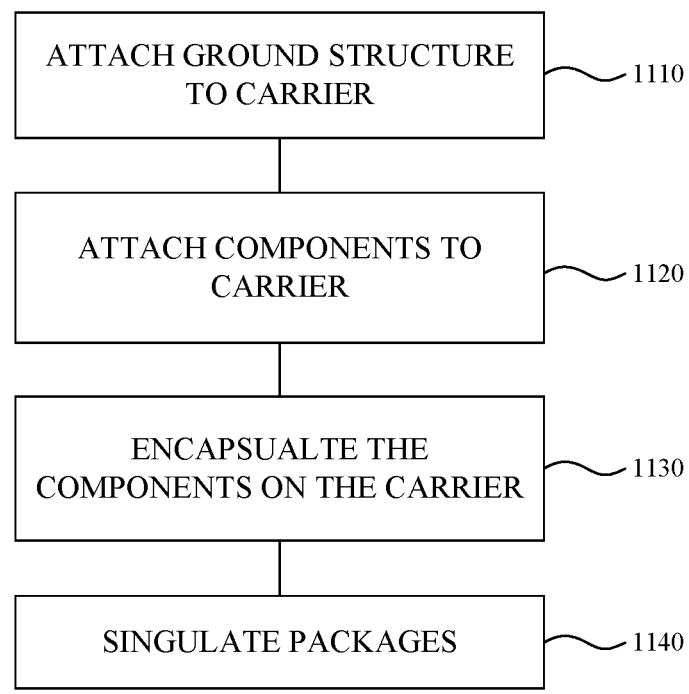
FIG. 1 is a flow chart illustrating a method of forming a package including a substrate-less integrated component in accordance with an embodiment.

Packages including substrate-less integrated components and methods of fabrication are described that may aid in the formation in thin, miniaturized, low cost packages such as system in packages (SiPs). In an embodiment the package thickness (z-height) can be slightly thicker than the thickest (tallest) component within the package, such as a passive component. A de-bondable carrier is used to allow strip or panel based manufacturing of the package. For example, the packaging methods may be compatible with conventional strip-based BGA or chip scale packaging (CSP) infrastructure. In accordance with embodiments, assembly is performed directly on the de-bondable carrier, which is removed after component (and die) encapsulation to allow the final substrate-less component structure with exposed component (and optionally die) terminals. Further exposure and application of solder or conductive material to the bottom terminals allows for surface mounting of the package with good yield and reliability.

In accordance with embodiments, the BGA substrate strip (e.g. core substrate, core-less substrate, etc.) used in conventional strip-based BGA assembly processes may be eliminated. Thin package thickness (z-height) may additionally be achieved in accordance with embodiments by the elimination of the conventional BGA substrate strip. In an embodiment, no routing is provided on the bottom side of the package, and the encapsulated components may be directly bonded (e.g. with solder joint) to a motherboard, or printed circuit board (PCB). Alternatively, routing may optionally be formed after debonding of the carrier and prior to solder bump attachment. In an embodiment, an integrated ground structure (e.g. ring) connects an electromagnetic interference (EMI) shield to terminals on the bottom side of the package.

In one aspect, various de-bondable carrier structures are described to allow for the package die or component terminal exposure depending on the type of die or component and terminals. The carrier type or material can be selected to provide the proper warpage, dimensional stability, and stiffness during the manufacturing process. Embodiments include using die or components with or without solder bumps and thin, thick, or selectively thick release layers (e.g. adhesives) as part of the carrier. Terminal exposure on the bottom side of the package can also be further enhanced by grinding, burnishing, or laser processing. Terminals can have solder or conductive materials applied.

In one aspect, various carrier ground structure designs are described. The ground structure (e.g. ring, frame) design can integrate compartment shielding, fiducials, alignment marks, mold gate, vent areas, etc. to facilitate the package manufacturing process. Compartment shielding (shield walls within the package) may also be achieved by designing the ground structure accordingly. The ground structure can additionally allow for proper strip warpage and stiffness after carrier detach. Various shield structures are also described, for example for electromagnetic interference (EMI) shielding. In one embodiment, an EMI shield is sputtered on the top and sides of the package after package singulation. In other embodiments, various ground ring and sidewall shield structures are described that may allow for the EMI self-shield to be executed at the strip or panel level. In such configurations, it may not be necessary to sputter the EMI shield on both, or either of, the top and sides of the package after package singulation. Strip and panel based sidewall shielding may be achieved by various structures, such as, a thicker ground structure, a ground structure with projections on top that are exposed by grinding after encapsulation, trench and fill techniques with conductive material after encapsulation, and needle pins.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known packaging techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "spanning", "to", "between", and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a flow chart is provided illustrating a method of forming a package including a substrate-less integrated component in accordance with an embodiment. In interest of clarity, the following description of FIG. 1 is made with regard to reference features found in other figures described herein. At operation 1110 a ground structure 110 is attached to a temporary carrier 102. A plurality of components 120 are attached to the temporary carrier 102 at operation 1120. Components 120 may be a variety of devices, including passive devices, such as capacitors or inductors, MEMS devices, sensors, etc. At operation 1130 the ground structure 110 and components 120 are encapsulated, for example with a molding compound 140, on the temporary carrier 102. A plurality of packages 150 may then be singulated at operation 1140, for example, after removal of the temporary carrier 102. The packaging method may additionally include the formation of EMI shielding. In some embodiments, a conductive shielding layer 160 is formed post-singulation for EMI shielding. In various embodiments, EMI shielding is fabricated pre-singulation, for example, at the strip or panel level.

In accordance with some embodiments, solder bumps 124 may be applied to component 120 terminals 122 prior to package singulation. Thus, embodiments describe methods and structures for integrating substrate-less components 120 within a package 150 in which the integrated components 120 may be directly bonded to a circuit board or mother board. In this manner, the total package 150 z-height may correspond substantially to the integrated component 120 height.

In accordance with some embodiments, singulation may include cutting through the ground structure 110. In accordance with some embodiments, singulation may include cutting through a solder bump 114 already formed on the ground structure 110.

Figure 2A:
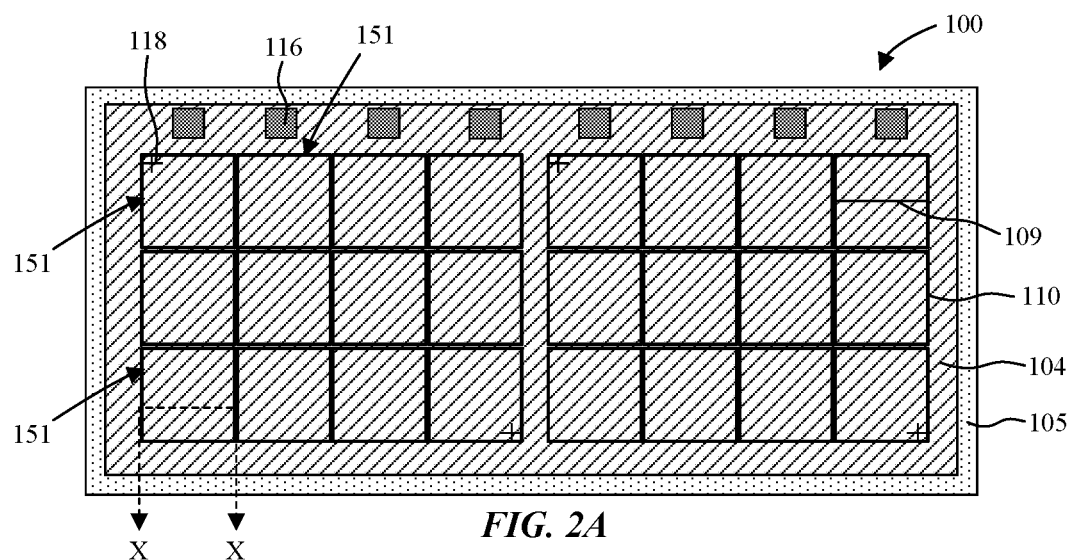
FIG. 2A is a schematic top view illustration of a ground structure attached to a carrier in accordance with an embodiment.

FIG. 2A is a schematic top view illustration of a substrate strip 100 including a ground structure 110 attached to a carrier 102 in accordance with an embodiment, for example, corresponding to operation 1110. Specifically, FIG. 2A illustrates a ground structure 110 attached to a release layer 104 on an optional support substrate 105. The optional support substrate 105 may be formed of a variety of materials, such as a laminate, though other materials such as glass or metal plate may be used. Carrier 102 may be strip sized as illustrated, or alternatively full panel sized. For example, in the strip size, the carrier may be suitable for conventional BGA assembly instruments. In accordance with embodiments, an exemplary release layer 104 may be an adhesive film (e.g. tape), or thermally releasable film.

Figure 2B:
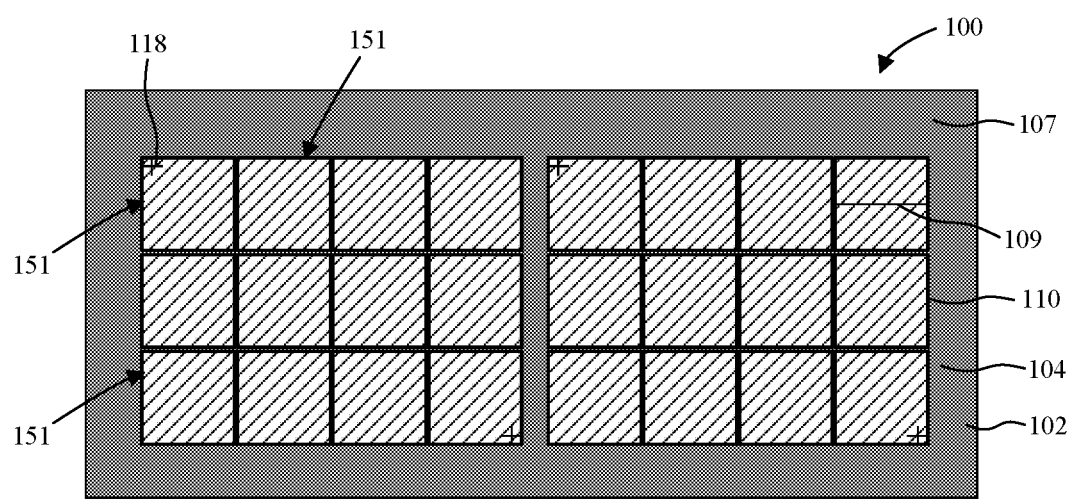
FIG. 2B is a schematic top view illustration of a ground structure of a metal lead frame attached to a carrier in accordance with an embodiment.

In accordance with embodiments, a ground structure 110 may be attached to the carrier 102, or more specifically, to the release layer 104 optionally supported by support substrate 105. The ground structure 110 may be part of a metal lead frame. In the embodiment illustrated in FIG. 2B the substrate strip 100 includes a metal lead frame 107 including a ground structure 110 attached to a carrier 102, or more specifically to a release layer 104 optionally supported by support substrate 105. Additional components may also be attached to the release layer 104 illustrated in FIGS. 2A-2B, such as compartment shielding, fiducial marks or alignment marks 118, mold gates 116 (for mold degating), vents, etc. to facilitate the package manufacturing process. The additional components may be separately attached to the release layer 104 or included with the ground structure 110, for example, as part of a metal lead frame 107. In the particular embodiments illustrated in FIGS. 2A-2B, the ground structure 110 may include a plurality of ground ring areas. Each ground ring area may correspond to a separate package area 151 which will subsequently be singulated. The ground structure 110 may additionally include compartment shielding 109, illustrated in only a single package area 151 for clarity.

Figure 3A:
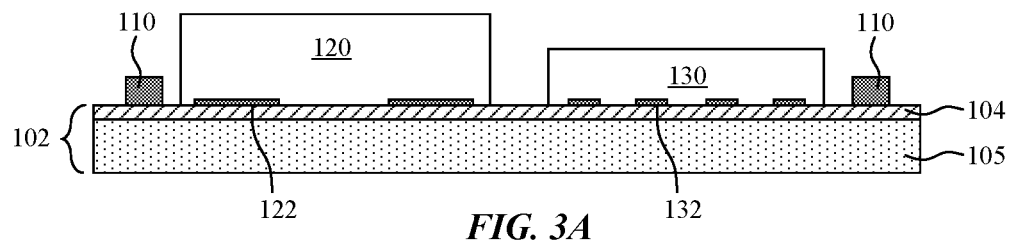
FIG. 3A is a schematic cross-sectional side view illustration taken along line X-X of FIG. 2A of a component and a die without solder bumps attached to a carrier in accordance with an embodiment.
Figure 3B:
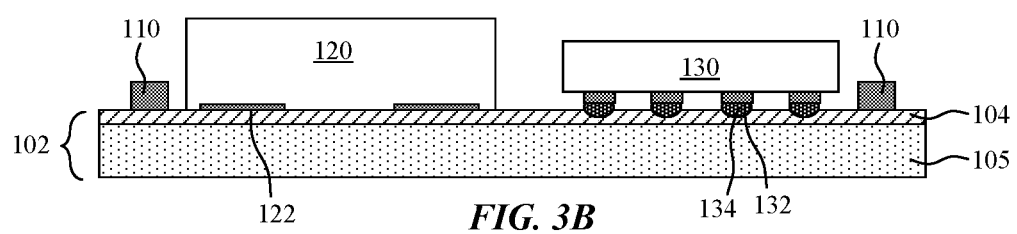
FIG. 3B is a schematic cross-sectional side view illustration taken along line X-X of FIG. 2A of a component and a die with solder bumps attached to a carrier in accordance with an embodiment.
Figure 4:
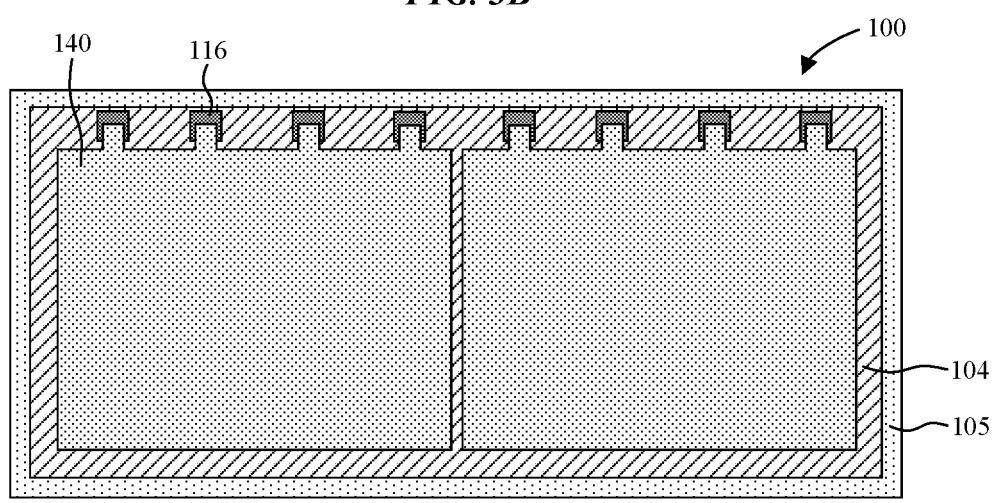
FIG. 4 is a schematic top view illustration after encapsulation on a carrier in accordance with an embodiment.

Referring now to FIGS. 3A-3B, FIG. 3A is a schematic cross-sectional side view illustration taken along line X-X of FIG. 2A after attaching a component 120 and die 130 without solder bumps to a carrier in accordance with an embodiment, and FIG. 3B is a schematic cross-sectional side view illustration taken along line X-X of FIG. 2A after attaching component 120 and die 130 with solder bumps to a carrier in accordance with an embodiment. As illustrated, the components 120 and die 130 are attached face down, with terminals 122, 132, and optionally solder bumps 134, facing toward the release layer 104 and support substrate 105. As shown, the components 120 and die 130 are attached face down onto the release layer 104 laterally adjacent to the ground structure 110 (e.g. ground ring) for each package area 151. In the embodiment illustrated in FIG. 3B, the protruding solder bumps 134, and optionally protruding terminals 132, may be embedded into the release layer 104. Depth of penetration may at least partially be controlled by thickness of the release layer 104. In accordance with embodiments, die 130 may be active die, such as logic, or system on chip. In an embodiment, die 130 are memory (e.g. DRAM) die. Components 120 may be a variety of devices, including passive devices, such as capacitors or inductors, MEMS devices, sensors, etc. Following attaching the components 120 and die 130 to the release layer 104, the components 120, die 130, and ground structure 110 can be encapsulated within a molding compound 140 as illustrated in FIG. 4.

Figure 5:
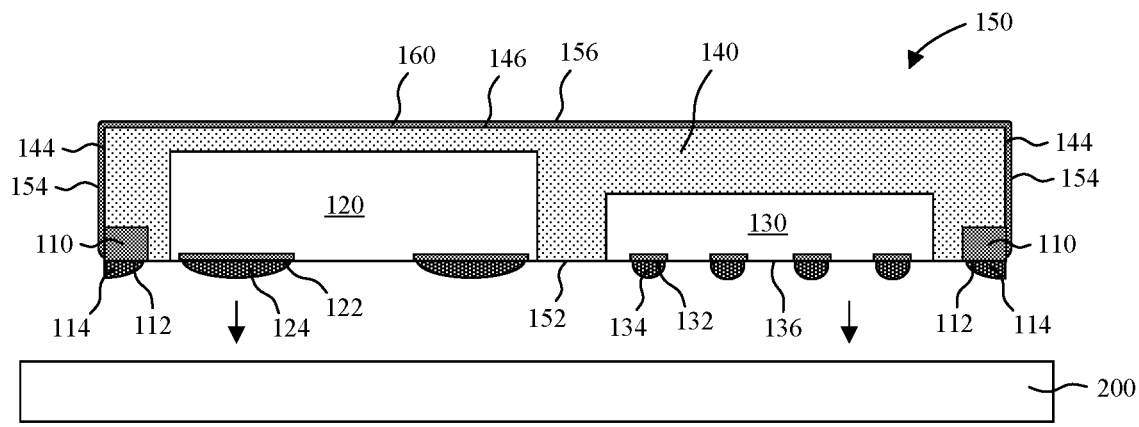
FIG. 5 is a schematic cross-sectional side view illustration of a package including a substrate-less integrated component and a die without pre-formed solder bumps in accordance with an embodiment.
Figure 6:
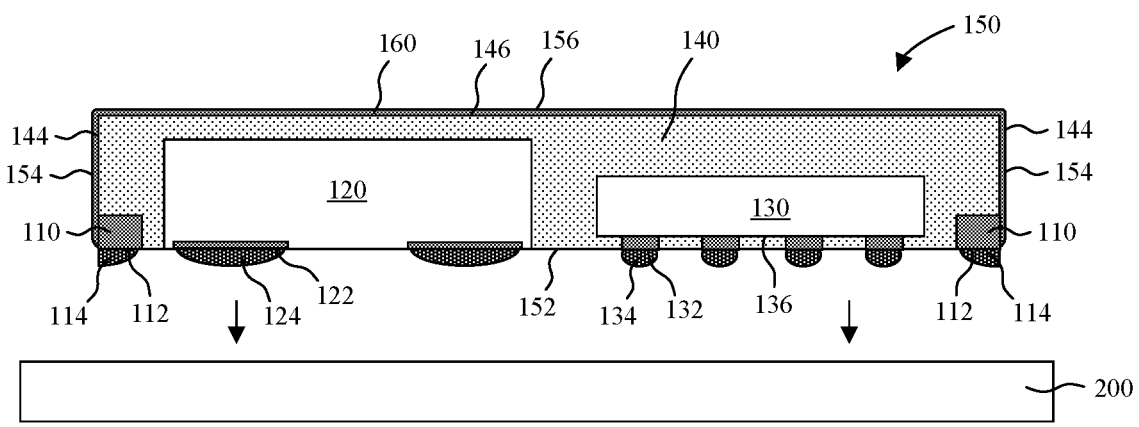
FIGS. 6-7 are schematic cross-sectional side view illustrations of packages including substrate-less integrated components and die with pre-formed solder bumps in accordance with embodiments.
Figure 7:
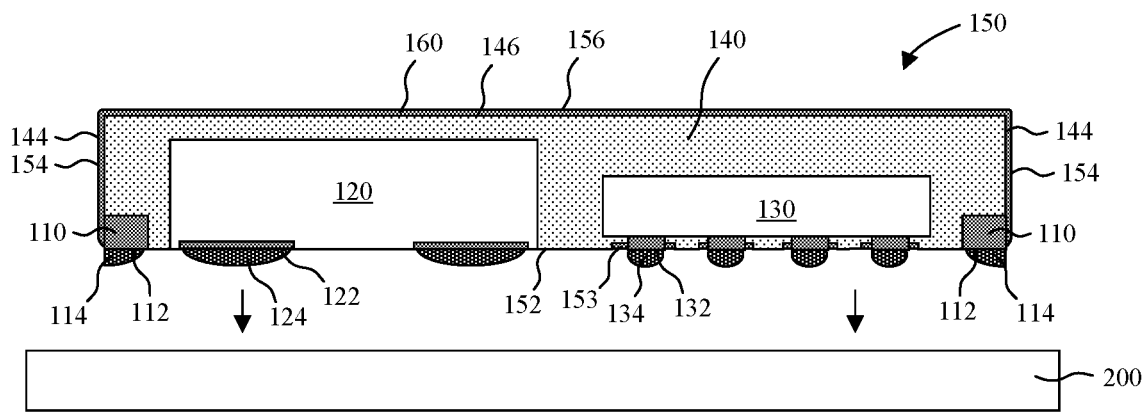

Following encapsulation, the carrier 102 (e.g. optional support substrate 105 and release layer 104) may be removed, exposing component terminals 122, ground structure terminals 112, and die terminals 132 if solder bumps are not already present. Solder bumps may then be applied to the exposed terminals of the components 120, die 130, and ground structure 110, followed by singulation into a plurality of packages 150. FIGS. 5-7 include various schematic cross-sectional side view illustrations of packages 150 including substrate-less integrated components and die 130 with and without pre-formed solder bumps. In the particular embodiments illustrated in FIGS. 5-7, solder bumps 114 are applied to the exposed terminals 112 of ground structure 110, and solder bumps 124 are applied to the exposed terminals of the components 120 prior to singulation into packages 150. The exposed terminals 112, 122 may be along what will be the bottom surface 152 of the package 150. In the embodiment illustrated in FIG. 5, solder bumps 134 are applied to the exposed terminals 132 of die 130 prior to singulation. In the embodiment illustrated in FIG. 6, the solder bumps 134 may have been pre-applied, for example, as illustrated in FIG. 3B. In the embodiment illustrated in FIG. 7, the solder bumps 134 may also have been pre-applied, and laser ablation or another suitable technique is used to create openings 153, in what will be the bottom surface 152 of the package 150, to reveal solder bumps 134. Alternatively, solder bumps 134 can be applied after forming openings 153 to expose terminals 132. After singulation, the packages 150 may be in condition for bonding to a circuit board or mother board 200.

In the embodiments illustrated in FIGS. 5-7, an electrically conductive shielding layer 160 (e.g. metal layer) may be formed on the exposed sidewalls 144 and top surfaces 146 of the molding compound, for example, by sputtering for electromagnetic interference (EMI) shielding. Shielding layer 160 may be in electrical contact with ground structure 110. In an embodiment, after cutting or sawing to singulate the package structures, the package structures can be placed on another tape layer followed by sputtering to form the shielding layer 160 on the sidewalls 144 and top surface 146 of the molding compound 140, as well as on the exposed side surface of the ground structure 110. The solder bumps along the bottom surface 152 of the packages 150 may be embedded in the tape layer during sputtering so that shielding layer 160 does not cover the solder bumps. The packages 150 may then be removed from the tape layer. As illustrated, the shielding layer 160 may form the package 150 sidewalls 154 and top surface 156. It is to be appreciated that the electrically conductive shielding layer 160 illustrated in FIGS. 5-7 is one of several possible EMI shielding structures in accordance with embodiments. Accordingly, the embodiments illustrated are not limited to the EMI shielding shown in FIGS. 5-7, and it is not required for the EMI shielding to be exposed along the package sidewalls 154 and top surface 156.

Figure 8:
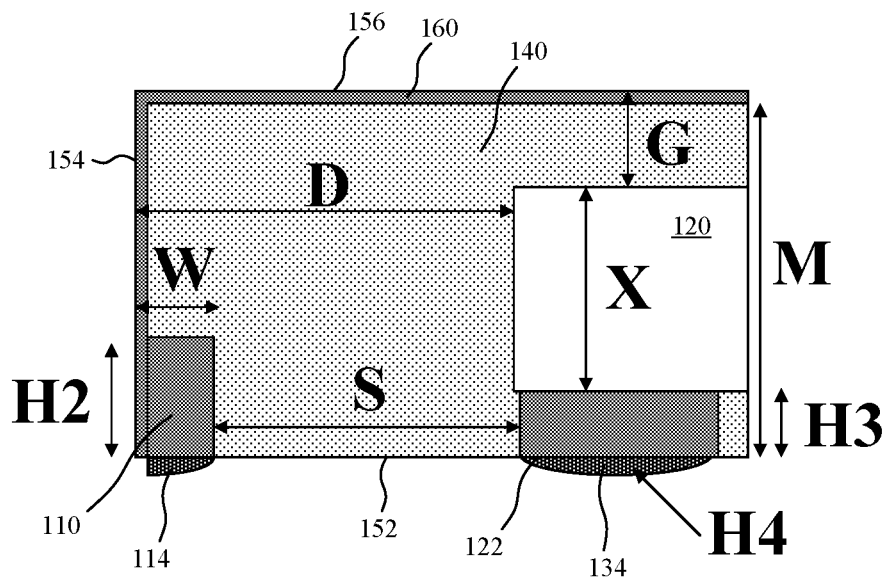
FIG. 8 is a close-up schematic cross-sectional side view illustration of package dimensions in accordance with an embodiment.

Referring now to FIG. 8 a close-up schematic cross-sectional side view illustration is provided in order to illustrate potential package dimension contributions in accordance with embodiments. With regard to z-height, embodiments describe structural configurations in which overall package z-height can be attributed primarily to component 120 thickness. For example, H3 corresponds to a stand-off height between the bottom of the component 120 and component terminal 122 along the bottom surface 152 of the package. In accordance with embodiments, H3 may nominally be zero. Accordingly, the remainder of the package z-height may be attributed to thickness H4 of the component solder bump 134, and G, distance from the top of component 120 to the top surface 156 of the package 150. For example, G may be attributed to thickness of the EMI shielding layer 160 over the component 120 and any molding compound 140 over the top surface of the component 120.

In accordance with embodiments, package width reductions may additionally be realized by cutting through the ground structure 110 along edges of the packages 150. For example, the total distance D laterally between the component 120 and package sidewall 154 may be primarily attributed to the separation S needed between component terminals 122 and the ground structure 110. In an embodiment, width W of the ground structure 110 and EMI shielding layer 160 is less than separation S.

Figure 9:
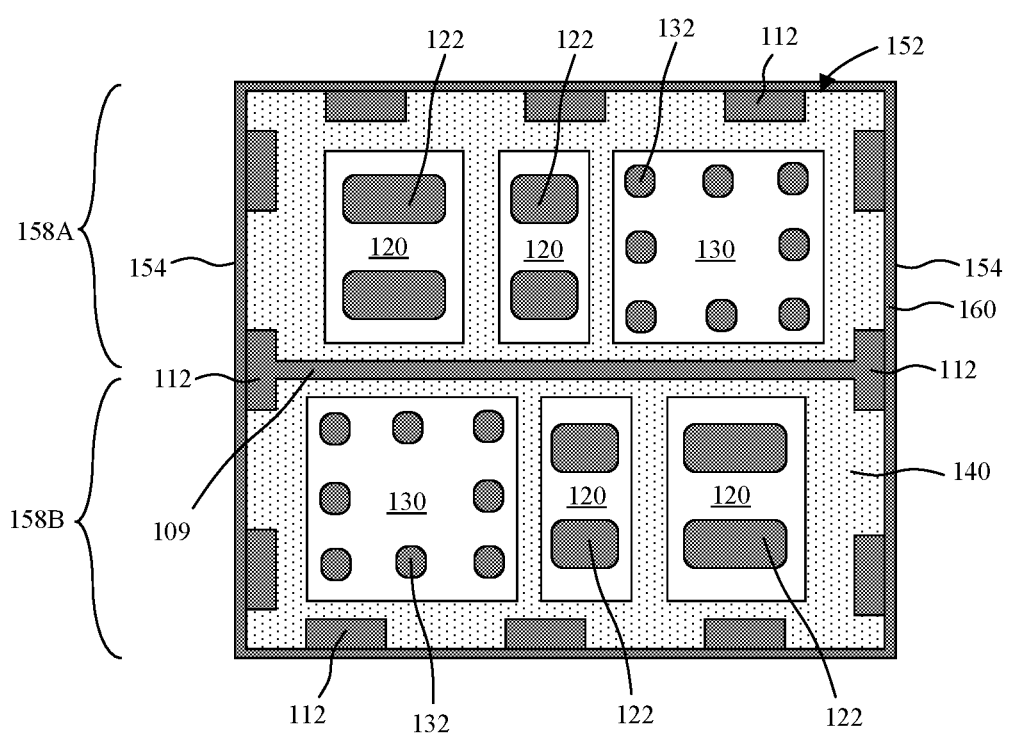
FIG. 9 is a schematic bottom view illustration of a package and exposed bottom terminals or bumps after carrier detach in accordance with an embodiment.

FIG. 9 is a schematic bottom view illustration of a package bottom surface 152 and exposed bottom terminals or optionally bumps after carrier detach in accordance with an embodiment. As illustrated, the bottom surface 152 may include exposed portions of molding compound 140, one or more components 120, and one or more die 130. Additionally, the component terminals 122 and die terminals 132 (or optionally solder bumps) may be exposed. As illustrated, ground structure terminals 112 may also be exposed. In the embodiment illustrated, the ground structure terminals 112 may be laterally separated so that a continuous line is not formed around the edges of the package. Referring briefly to the ground structures 110 illustrated in FIGS. 15-17, the ground structure terminals 112 may protrude down from a core structure of the ground structure (e.g. ring). Alternatively, the ground structure terminals 112 may correspond to a ground ring along edges of the package. In the particular embodiment illustrated in FIG. 9, compartment shielding 109 is illustrated shielding different compartments 158A, 158B (e.g. including components 120 and/or die 130) from one another. Compartment shielding 109 may be in the form of a ring or line, as illustrated, or alternatively include a series of terminals similar to ground structure terminals 112.

Figure 10:
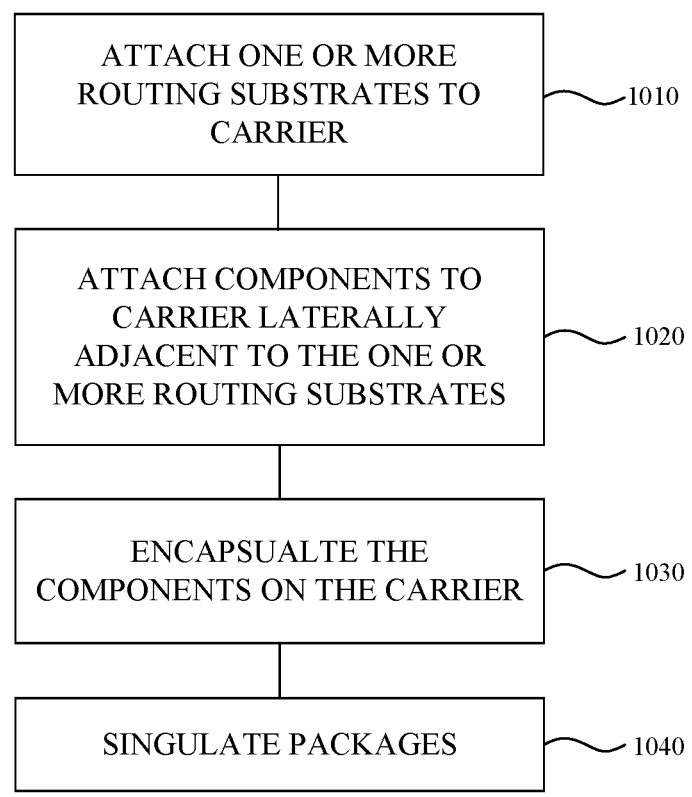
FIG. 10 is a flow chart illustrating a method of forming packages including a substrate-less integrated component in accordance with an embodiment.

Referring now to FIG. 10 a flow chart is provided illustrating a method of forming packages including a substrate-less integrated component in accordance with an embodiment. In interest of clarity, the following description of FIG. 10 is made with regard to reference features found in other figures described herein. At operation 1010 one or more routing substrates 300 are attached to a temporary carrier 102, for example attached to a release layer 104. A ground structure 110 may optionally be separately attached to the carrier 102, or alternatively be contained within the one or more routing substrates 300. Additionally, the one or more routing substrate 300 may optionally include one or more embedded components 320 and/or die 330. A plurality of components 120 may then be attached to the carrier 102, for example attached to the release layer 104, laterally adjacent to the one or more routing substrates 300 at operation 1020. At operation 1030 the components 120 are encapsulated, for example with a molding compound 140, on the temporary carrier 102. A plurality of packages 150 may then be singulated at operation 1040, for example, after removal of the temporary carrier 102.

Figure 11:
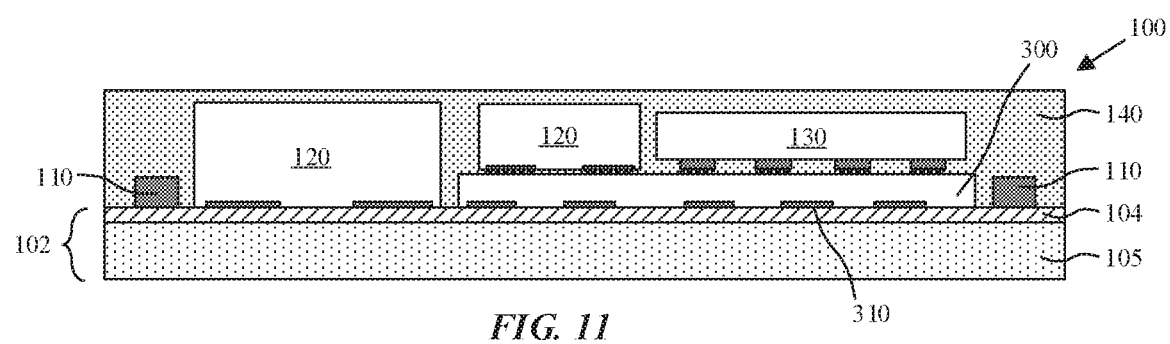
FIG. 11 is a schematic cross-sectional side view illustration of a component and a routing substrate attached to a carrier in accordance with an embodiment.
Figure 12:
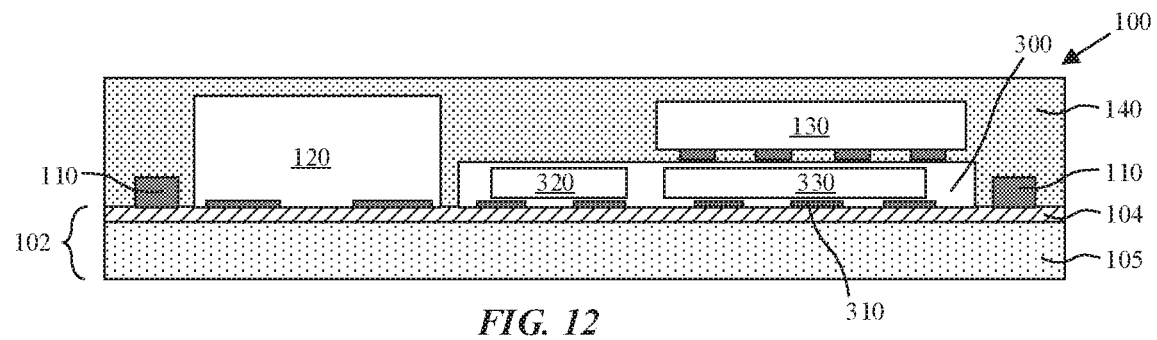
FIG. 12 is a schematic cross-sectional side view illustration of a component and a routing substrate including an embedded component attached to a carrier in accordance with an embodiment.

Referring now to FIGS. 11-14, various configurations are illustrated for a package area 151 of a substrate strip 100 including a substrate-less integrated component 120 and routing substrate 300 in accordance with embodiments. FIG. 11 is a close-up schematic cross-sectional side view illustration of a package area on the carrier 102 including a discrete routing substrate 300 attached to the release layer 104, component 120 attached to the release layer laterally adjacent to the routing substrate 300, and ground structure 110 attached to the release layer 104 laterally adjacent to the routing substrate 300. Additionally, one or more components 120 or die 130 may optionally be bonded to the routing substrate 300. In such an embodiment, the routing substrate 300 can be picked and placed onto the carrier 102 to enable routing for thinner components 120 while still allowing for taller components 120 within the package. In the embodiment illustrated, the molding compound 140 is applied over and encapsulates the ground structure 110 attached to the release layer 104, component 120 attached to the release layer 104, and the routing substrate 300 attached to the release layer 104, as well as any additional components 120 or die 130 bonded to the routing substrate 300. FIG. 12 is a close-up schematic cross-sectional side view illustration of a package area on the carrier 102 similar to that illustrated and described with regard to FIG. 11, with one difference being that the routing substrate 300 may optionally include one or more embedded components 320 and/or embedded die 330.

Figure 13:
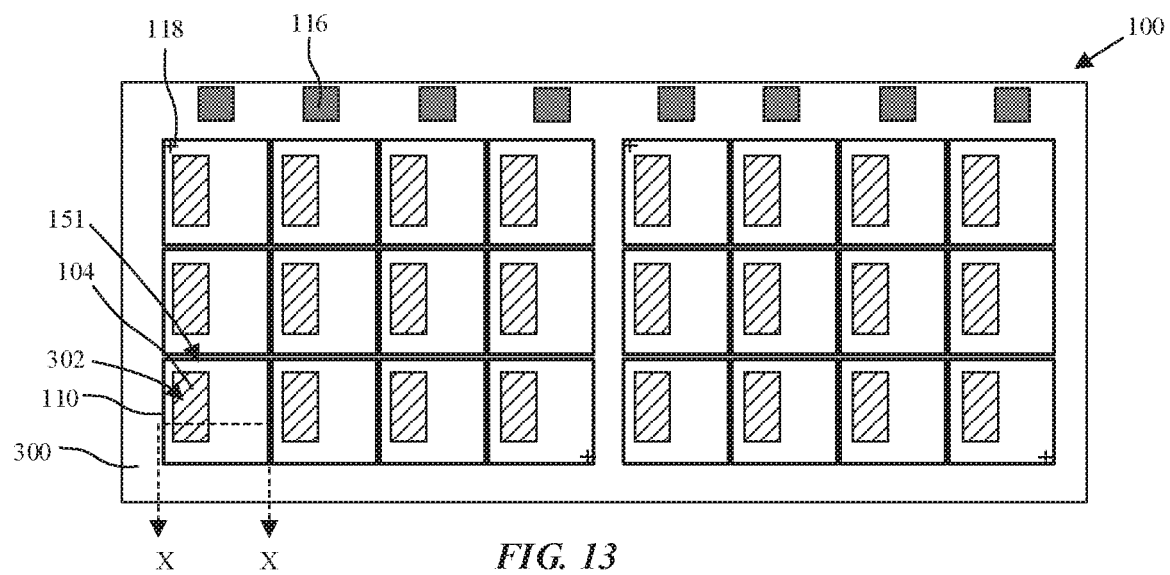
FIG. 13 is a schematic top view illustration of a substrate strip including a routing substrate with openings attached to a carrier in accordance with an embodiment.
Figure 14:
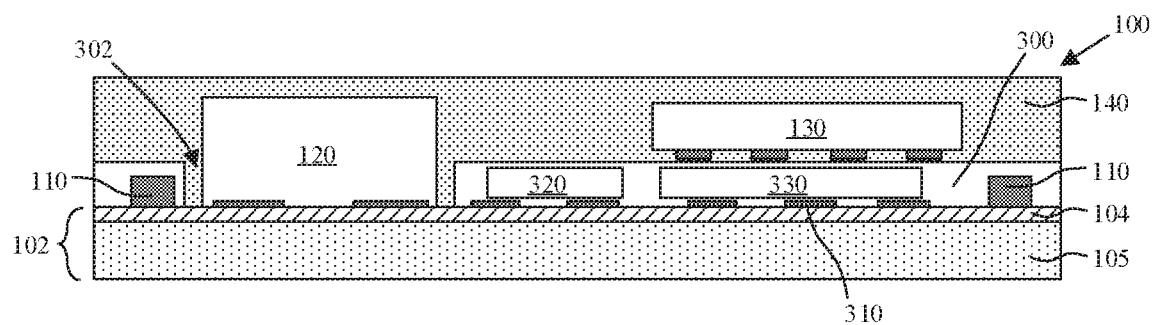
FIG. 14 is a schematic cross-sectional side view illustration taken along line X-X of FIG. 13 of a component attached to a carrier within an opening in a routing substrate attached to the carrier in accordance with an embodiment.

Referring now to FIG. 13 is a schematic top view illustration is provided of a substrate strip 100 including a routing substrate 300 including openings 302 attached to the carrier in accordance with an embodiment. FIG. 14 is a schematic cross-sectional side view illustration taken along line X-X of FIG. 13 of a component 120 attached to the carrier within an opening 302 in the routing substrate 300 in accordance with an embodiment. In the particular embodiment illustrated in FIGS. 13-14, rather than placing a separate discrete routing substrate 300 within each package area 151 on the carrier 102, a single routing substrate 300 including openings 302 may be attached over an array of package areas. As shown, the routing substrate 300 may include a ground structure 110, and optionally additional features such as compartment shielding 109, mold gates 116, fiducial marks or alignment marks 118, etc. In an embodiment, a plurality of components 120 are attached face down onto the release layer 104 within the plurality of openings 302 in the routing substrate 300. In the embodiment illustrated in FIG. 14, the molding compound 140 is applied over the component 120 and routing substrate 300 (including any components or die bonded to the routing layer) and encapsulates component 120 attached to the release layer 104 within the opening 302 in the routing substrate 300.

Following encapsulation with molding compound 140, the carrier 102 (e.g. release layer 104 and optional support substrate 105) may be removed exposing a plurality of routing substrate terminals 310 and a plurality of ground structure terminals 110. Solder bumps 114, 124, 134 may be applied to the plurality of ground structure terminals 110 and the plurality of exposed routing substrate terminals 310, and individual packages 150 may be singulated similarly as described above. In some embodiments, singulation may include cutting through the ground structure 110, and optionally solder bumps 114. An EMI shielding layer 160 may additionally be formed, similarly as described with regard to FIGS. 5-7. However, the embodiments illustrated are not limited to the ground structure 110 or EMI shielding layer 160 shown in FIGS. 5-7, and it is not required for the EMI shielding to be exposed along the package sidewalls 154 and top surface 156. Additional ground structures 110 and EMI shielding structures that may be utilized with the above embodiments described above with regard to FIGS. 1-14 are described below with regard to FIGS. 15-30H. Additionally, the various EMI shielding configurations described herein may be compatible with the various terminal and solder bump configurations described with regard to FIGS. 3A-3B and FIGS. 5-7, as well as the package variations including routing substrates 300 described with regard to FIGS. 11-14.

Figure 15:
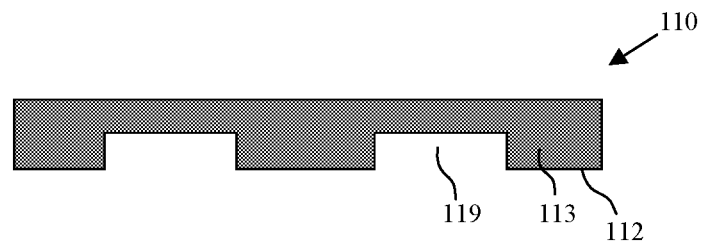
FIG. 15 is a schematic side view illustration of a thin ground structure in accordance with an embodiment.
Figure 16:
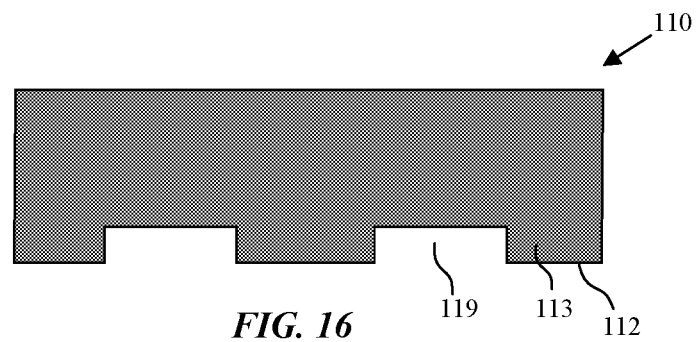
FIG. 16 is a schematic side view illustration of a thick ground structure in accordance with an embodiment.
Figure 18:
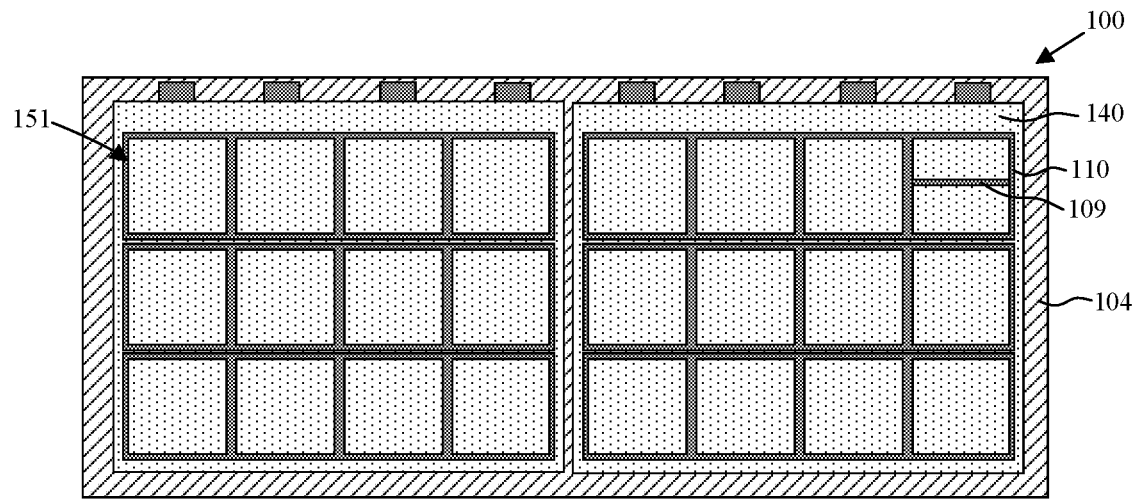
FIG. 18 is a schematic top view illustration of an exposed thick ground structure after encapsulation with a molding compound over the carrier in accordance with an embodiment.

In the above embodiments, an EMI shielding layer 160 was illustrated as being applied after package singulation, in which the EMI shielding layer 160 makes electrical contact with regions of the ground structure 110 (optionally including compartment shielding) that are exposed after package singulation. Referring briefly to FIG. 8 again, the height H2 of the ground structure 110 is shown as being less than the molding compound 140 thickness M. FIG. 15 is a schematic side view illustration of a thin ground structure 110 in accordance with an embodiment. As shown, the ground structure 110 may optionally have a saw-tooth shape including protrusions 113 and indentations 119, such that the exposed portions of the protrusions 113 may functions as terminals 112 of the ground structure 110, for example, as shown in FIG. 9. In accordance with embodiments, the height H2 of the ground structure 110 may be thin as illustrated in FIG. 15, or thick as illustrated in FIG. 16. In an embodiment, the height H2 of the ground structure 110 may be similar to the molding compound 140 thickness M. FIG. 18 is a schematic top view illustration of an exposed thick ground structure 110 after encapsulation with a molding compound 140 over the carrier in accordance with an embodiment. As shown, the ground structure 110 may form a ground ring around the package area. In an embodiment, ground structure 110 is a portion of a metal lead frame, similar as described with regard to FIG. 2B. In an embodiment, package singulation includes cutting along the ground ring structure. Exposed portions of ground structure 110 may additionally include exposed portions of compartment shielding 109. In interest of clarity, this is illustrated in only a single package area 151. In accordance with embodiments, the ground structure 110 (and optionally compartment shielding 109) may be exposed after encapsulation with an etch back or grinding operation.

Figure 17:
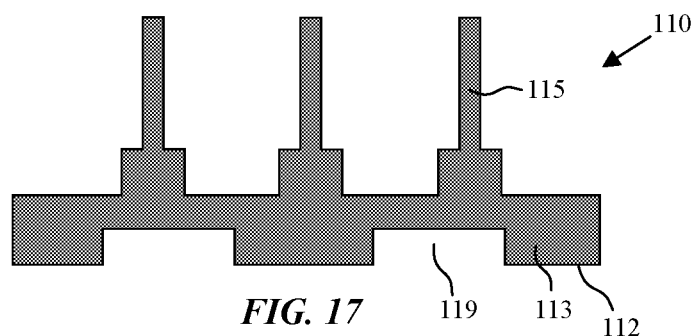
FIG. 17 is a schematic side view illustration of a ground structure including projections in accordance with an embodiment.
Figure 19:
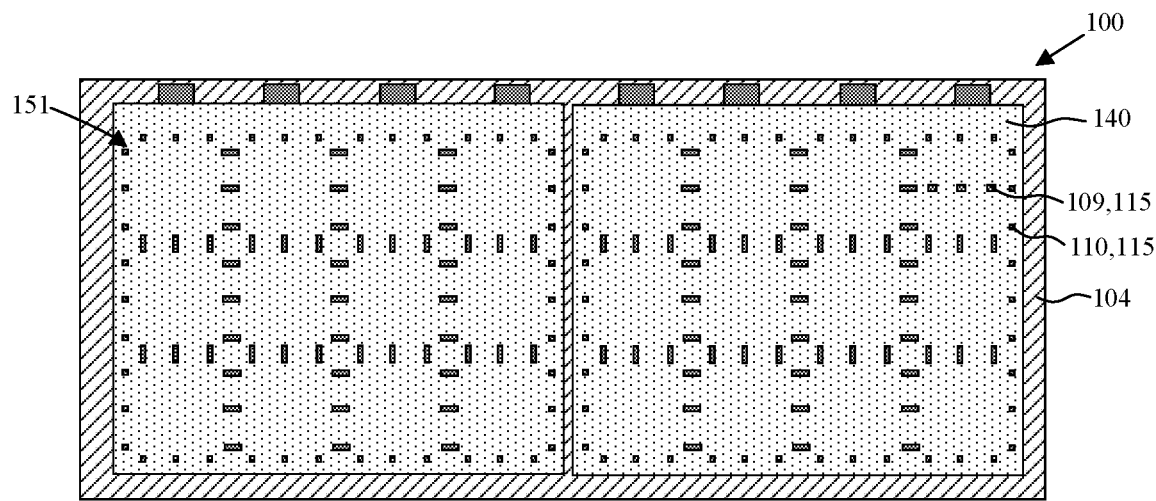
FIG. 19 is a schematic top view illustration of an exposed ground structure including projections after encapsulation with a molding compound over the carrier in accordance with an embodiment.

FIG. 17 is a schematic side view illustration of a ground structure 110 including projections 115 in accordance with an embodiment. The projections 115 may be integrally formed portions of the ground structure 110. The projections 115 may also be pins, or wires. For example, copper wires can be bonded to the ground structure 110. FIG. 19 is a schematic top view illustration of exposed projections 115 after encapsulation with a molding compound 140 over the carrier in accordance with an embodiment. As shown, the projections 115 may be discontinuous, and form a pattern around the package area. In an embodiment, package singulation includes cutting along the ground structure 110. Exposed projections 115 may additionally be connected compartment shielding 109, internally within the package areas 151. In interest of clarity, this is illustrated in only a single package area 151. In accordance with embodiments, projections 115 may be exposed after encapsulation with an etch back or grinding operation. In an embodiment, ground structure 110/projections 115 are a portion of a metal lead frame, similar as described with regard to FIG. 2B.

Figure 20:
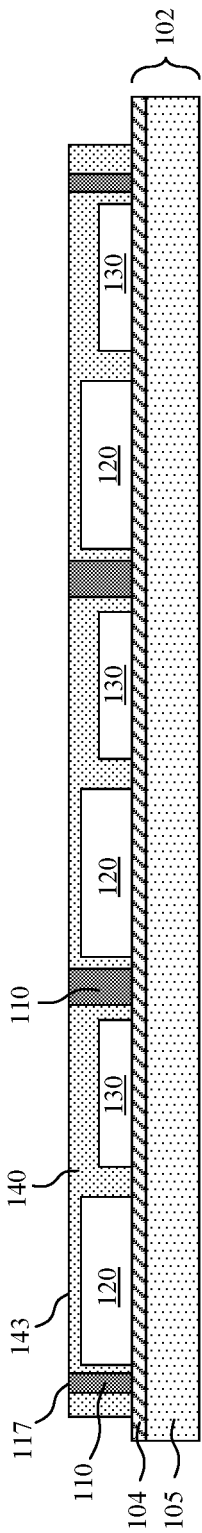
FIGS. 20-22 are schematic cross-sectional side view illustrations of method of forming exposed EMI shielding with a thick ground structure in accordance with an embodiment.
Figure 21:
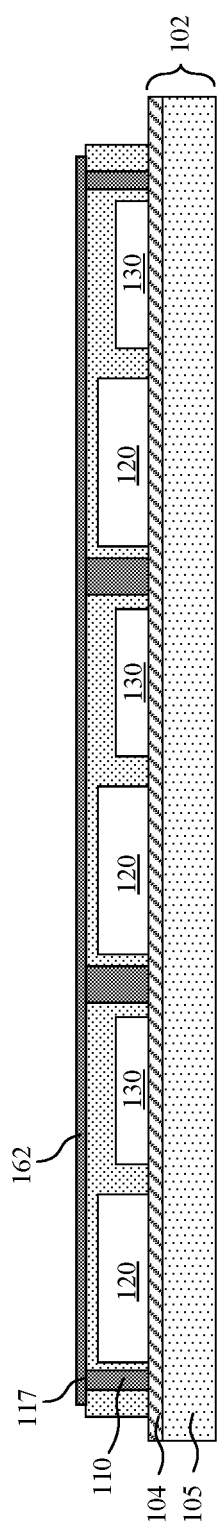
Figure 22:
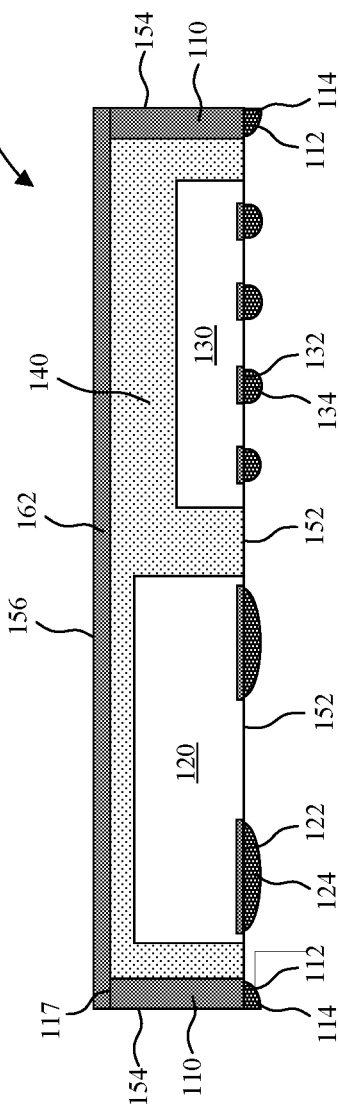

FIGS. 20-22 are schematic cross-sectional side view illustrations of method of forming exposed EMI shielding with a thick ground structure 110 in accordance with an embodiment. The ground structure 110 may be similar to that illustrated in FIG. 16 or FIG. 17 in an embodiment. In the particular sequence illustrated, EMI shielding can be formed at the panel level or strip level, as opposed to being formed after package singulation. FIG. 20 is a schematic cross-sectional side view illustration illustrating exposed top surfaces 117 of the ground structure 110 (and optionally compartment shielding) after encapsulation with the molding compound 140, and optionally after an etch back or grinding operation to reduce a thickness of the molding compound 140 and expose the top surfaces 117 of the ground structure 110. In an embodiment, the top surface 117 of the ground structure 110 and top surface 143 of the molding compound 140 are etched or ground after encapsulation to form a level top surface, though other operations may optionally be performed, and etching or grinding is not required. Following encapsulation, a top conductive layer 162 may be formed directly on the top surface 117 of the ground structure 110 (and optionally compartment shielding), and also over the top surface 143 of the molding compound 140. In an embodiment, solder bumps 114 are applied to ground structure terminals 112. Solder bumps 124 may also be applied to component terminals 122. Solder bumps 134 may optionally be applied to die 130 terminals 132 if not already present. In an embodiment, package 150 singulation includes cutting through the ground structure 110 and solder bumps 114.

Figure 23:
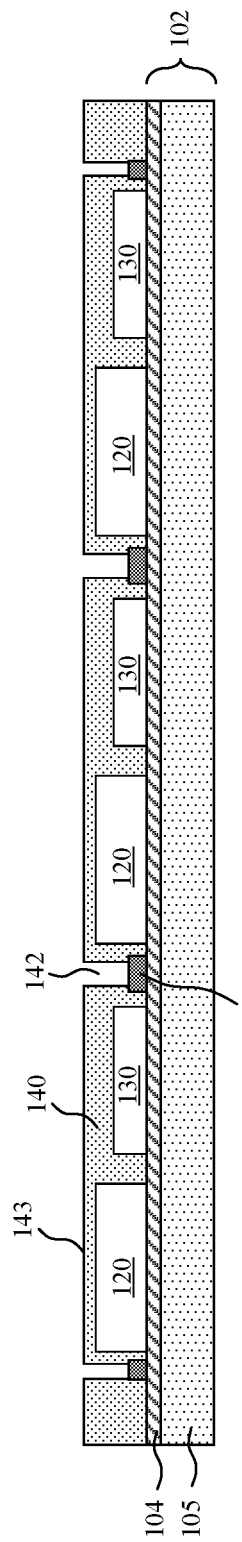
FIGS. 23-25 are schematic cross-sectional side view illustrations of method of forming exposed EMI shielding with filled trenches in accordance with an embodiment.
Figure 24:
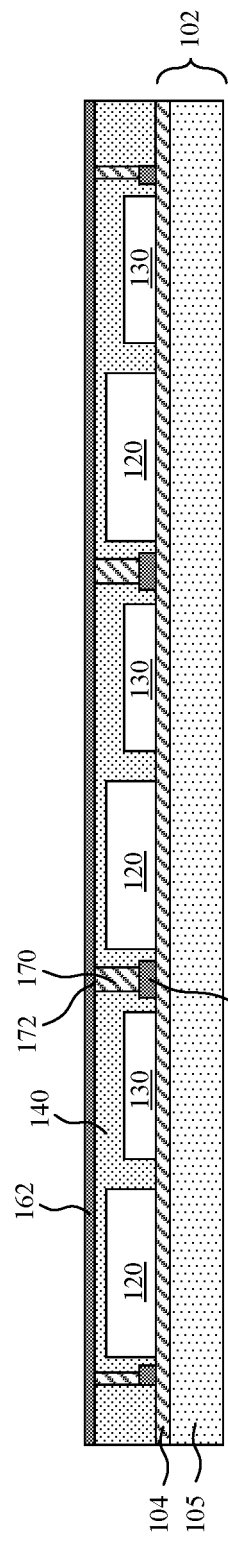
Figure 25:
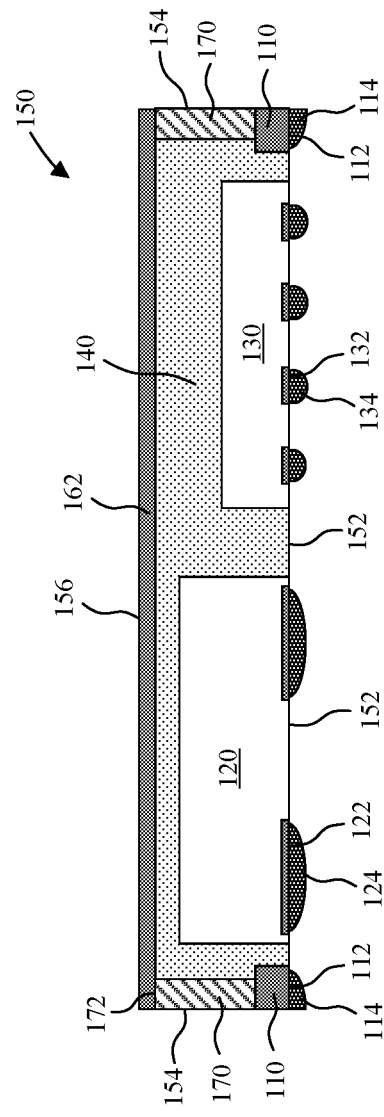

FIGS. 23-25 are schematic cross-sectional side view illustrations of method of forming exposed EMI shielding with filled trenches in accordance with an embodiment. The ground structure 110 may be similar to that illustrated in FIG. 15 or FIG. 17 in an embodiment. In the particular sequence illustrated, EMI shielding can be formed at the panel level or strip level, as opposed to being formed after package singulation. FIG. 23 is a schematic cross-sectional side view illustration after encapsulation with a molding compound 140, and the formation of trenches 142 in the molding compound 140 to expose the ground structure 110 (and optionally compartment shielding). Exemplary methods for forming trenches 142 include laser drilling and cutting with a blade saw, etc. Following the formation of trenches 142, a conductive fill material 170 if formed within the trenches 142, as illustrated in FIG. 24. The conductive fill material 170 may be formed in a variety of manners including application of a conductive paste, sputtered film formation, and electrolytic plating. In an embodiment, a conductive paste (e.g. see also FIG. 28E) is applied that completely fills the trenches 142. In an embodiment, an electrolytic plated conductive fill material completely fills the trenches 142 (e.g. see also FIG. 27E). A sputtered or electrolytic plated layer (e.g. see also FIGS. 26E and 30E) may be a thin layer (and not completely fill the trenches, e.g. form a conformal outline) or a thick layer that fills the trenches 142. Alternatively, the conductive fill material can be copper wires (e.g. projections 115) bonded to the ground structure 110, or pins (e.g. projections 115) attached to the ground structure 110, either before or after formation of the trenches 142.

In an embodiment a grinding operation may be performed to expose the top side 143 of the molding compound, or remove any excess material. A top conductive layer 162 may be formed directly on the top surface 172 of the conductive fill material 170, and also over the top surface 143 of the molding compound 140. In an embodiment, solder bumps 114 are applied to ground structure terminals 112. Solder bumps 124 may also be applied to component terminals 122. Solder bumps 134 may optionally be applied to die 130 terminals 132 if not already present. In an embodiment, package 150 singulation includes cutting through the ground structure 110 (and optionally conductive fill material 170) and solder bumps 114.

Referring now to FIGS. 26A-26H schematic cross-sectional side view illustrations are provided of a method of forming insulated EMI shielding with trenches and conductive film formation at the panel or substrate strip level in accordance with an embodiment. As shown in FIGS. 26A-26B a ground structure 110, plurality of components 120, and plurality of die 130 may be attached to a carrier 102 (e.g. release layer 104 optionally supported by a support substrate 105) as previously described. The particular arrangement is exemplary, and embodiments are not limited. For example, component and/or die, and optionally one or more routing substrates may be attached to the carrier as previously described. A molding compound 140 is then applied over the substrate strip 100 to encapsulate the ground structure 110, plurality of components 120, and plurality of die 130 as illustrated in FIG. 26C. In an embodiment, the molding compound 140 is a film that is laminated, and cured. A top conductive layer 162 (e.g. copper film) may be laminated along with the molding compound 140. Alternatively, a top conductive layer 162 may be applied after lamination of the molding compound 140.

Following encapsulation, trenches 142 are formed through the top conductive layer 162 and molding compound 140 to expose the ground structure 110 (and optionally compartment shielding), for example by laser etching, as shown in FIG. 26D. A metal cap layer 180 is then formed over the substrate strip 100. As shown in FIG. 26E, the metal cap layer 180 may be formed over the top surface 166 of top conductive layer 162, along sidewalls 144 of the molding compound 140, and on the top surface 117 of the ground structure 110. In an embodiment, metal cap layer 180 is formed by electrolytic copper plating over the carrier 102 (e.g. panel or strip). A top passivation layer 190 may then be formed over the metal cap layer 180 as illustrated in FIG. 26F. For example, the top passivation layer 190 may be a laminated and cured molding compound layer. Referring to FIGS. 26G-26H, the carrier 102 may be removed, followed by application of solder bumps to the exposed terminals, and package 150 singulation as previously described. In an embodiment, package singulation includes cutting through the ground structure 110, and optionally solder bumps 114. In the embodiment illustrated, package singulation additionally includes cutting through the top passivation layer 190 and metal cap layer 180. As shown, package sidewalls 154 are primarily formed of the top passivation layer 190.

Referring now to FIGS. 27A-27F schematic cross-sectional side view illustrations are provided of a method of forming semi-insulated EMI shielding with trenches and conductive film formation at the panel or substrate strip level in accordance with an embodiment. FIGS. 27A-27C are substantially similar to FIGS. 26A-26C with one difference being the thickness of the ground structure 110. In the particular embodiment illustrated the height H2 of the ground structure 110 is taller than the thickness X of the tallest component 120. Referring now to FIG. 27D shallow trenches 142 are formed through the top conductive layer 162 and molding compound 140 to expose the ground structure 110 (and optionally compartment shielding), for example by laser etching.

A metal cap layer 180 is then formed over the substrate strip 100. As shown in FIG. 27E, the metal cap layer 180 may be formed over the top conductive layer 162, within trenches 142, and on the ground structure 110. In an embodiment, the metal cap layer 180 completely fills the shallow trenches 142. In an embodiment, metal cap layer 180 is formed by electrolytic copper plating over the carrier 102 (e.g. panel or strip). A top passivation layer 190 may then be formed over the metal cap layer 180 as illustrated in FIG. 27E. For example, the top passivation layer 190 may be a laminated and cured molding compound layer. Referring to FIG. 27F, the carrier 102 may be removed, followed by application of solder bumps to the exposed terminals, and package 150 singulation as previously described. In an embodiment, package singulation includes cutting through the ground structure 110, and optionally solder bumps 114. In the embodiment illustrated, package singulation additionally includes cutting through the top passivation layer 190 and metal cap layer 180. Cutting may or may not be through the filled trenches 142. As shown, package sidewalls 154 may be primarily formed of the ground structure 110.

Referring now to FIGS. 28A-27F schematic cross-sectional side view illustrations are provided of a method of forming insulated EMI shielding with trenches and conductive film formation at the panel or substrate strip level in accordance with an embodiment. FIGS. 28A-28C are substantially similar to FIGS. 26A-26C. Referring now to FIG. 28D trenches 142 are formed through the top conductive layer 162 and molding compound 140 to expose the ground structure 110 (and optionally compartment shielding), for example by sawing. Referring to FIG. 28E, the trenches 142 can be filled with a conductive fill material 170, such as a conductive paste, and then leveled. A top passivation layer 190, such as a resin film, may then be laminated over the leveled conductive fill material and top conductive layer 162.

Referring to FIG. 28F, the carrier 102 may be removed, followed by application of solder bumps to the exposed terminals, and package 150 singulation as previously described. In an embodiment, package singulation includes cutting through the ground structure 110, and optionally solder bumps 114. In the embodiment illustrated, package singulation additionally includes cutting through the top passivation layer 190 and top conductive layer 162. Cutting may or may not be though the filled trenches 142. As shown, package sidewalls 154 are primarily formed of the molding compound 140.

FIGS. 29A-29F are schematic cross-sectional side view illustrations of method of forming EMI shielding with needle pins 192 at the panel or substrate strip level in accordance with an embodiment. As shown in FIGS. 29A-29B a ground structure 110, plurality of components 120, and plurality of die 130 may be attached to a carrier 102 (e.g. release layer 104 supported by a support substrate 105) as previously described. In the particular embodiment illustrated the height H2 of the ground structure 110 may be similar to thickness X of the tallest component 120. Needle pins 192 can be formed on the top surface 117 of ground structure 110 (and optionally compartment shielding) before or after attaching the ground structure to the release layer 104. For example, needle pins 192 may be silver or nickel paste. The needle pins 192 may function to provide a certain clearance of the EMI shielding over the tallest component, as well as a piercing function. Referring now to FIG. 29C, a molding compound 140 is then applied over the substrate strip 100 to encapsulate the ground structure 110, plurality of components 120, and plurality of die 130. In an embodiment, the molding compound 140 is a film that is laminated. However, the film is not fully cured. For example, the molding compound 140 film may be B-stage cured. A top conductive layer 162 (e.g. copper film) may then be formed over the molding compound 140 so that the needle pins 192 penetrate and extend through the molding compound 140 to contact the top conductive layer 162. In an embodiment a passivation layer 190 is formed over the top conductive layer 162. For example, the top conductive layer 162 (e.g. copper foil) and passivation layer 190 (resin layer) may be applied together. In an embodiment, a panel-level or strip-level hot press and vacuum lamination is used to apply layers 162/190 while also fully curing the molding compound 140.

Referring to FIGS. 29E-29F, the carrier 102 may be removed, followed by application of solder bumps to the exposed terminals, and package 150 singulation as previously described. In an embodiment, package singulation includes cutting through the ground structure 110, and optionally solder bumps 114. In the embodiment illustrated, package singulation additionally includes cutting through the top passivation layer 190 and top conductive layer 162. Cutting may or may not be though the needle pins 192. As shown, package sidewalls 154 may be primarily formed of the ground structure 110.

FIGS. 30A-30H are schematic cross-sectional side view illustrations of method of forming insulated EMI shielding with trenches and conductive film formation in accordance with an embodiment. FIGS. 30A-30E are substantially similar to FIGS. 26A-26E. Referring now to FIG. 30F a second metal cap layer 195 is formed over and covers the metal cap layer 180. For example, the second metal cap layer 195 may be formed by electrolytic plating. In an embodiment, second metal cap layer 195 is formed of nickel. In an embodiment, the second metal cap layer may function as an anti-corrosion layer.

Referring to FIGS. 30G-30H, the carrier 102 may be removed, followed by application of solder bumps to the exposed terminals, and package 150 singulation as previously described. In an embodiment, package singulation includes cutting through the ground structure 110, and optionally solder bumps 114. In the embodiment illustrated, package singulation additionally includes cutting through the second metal cap layer 195 and metal cap layer 180. Cutting may or may not be though the needle pins 192. As shown, package sidewalls 154 may be primarily formed of the second metal cap layer 195.

In the above descriptions, various EMI shielding structures and methods of manufacture were described illustrating exemplary groupings of components 120 and die 130. It is to be appreciated that the groupings are exemplary and that embodiments are not so limited. For example, the various EMI shielding structures are compatible with the various terminal and solder bump configurations described with regard to FIGS. 3A-3B and FIGS. 5-7, as well as the package variations including routing substrates 300 described with regard to FIGS. 11-14.

In utilizing the various aspects of the embodiments, it would become apparent to one skilled in the art that combinations or variations of the above embodiments are possible for integrating substrate-less components. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A packaging method comprising:
attaching a ground structure to a carrier;
attaching a plurality of components face down to the carrier and laterally adjacent to the ground structure;
encapsulating the plurality of components within a molding compound;
removing the carrier;
exposing a bottom package surface including:
a bottom surface of the molding compound;
a plurality of component bottom surfaces, each component bottom surface including a plurality of component terminals; and
a plurality of ground structure terminals;
applying solder bumps to the exposed plurality of ground structure terminals and directly on the plurality of component terminals; and
singulating a plurality of packages after applying the solder bumps, each package including a component encapsulated within the molding compound,
wherein singulating the plurality of packages comprises cutting through the ground structure and the solder bumps applied to the plurality of ground structure terminals.

2. The packaging method of claim 1, further comprising:
attaching a plurality of die face down to the carrier; and
encapsulating the plurality of components, the ground structure, and the plurality of die within the molding compound.

3. The packaging method of claim 2, further comprising:
exposing a plurality of die terminals; and
applying solder bumps to the plurality of exposed die terminals prior to singulating the plurality of packages.

4. The packaging method of claim 1, further comprising:
attaching a routing substrate including routing substrate terminals face down to the carrier;
wherein attaching the plurality of components face down to the carrier comprises attaching the plurality of components to the carrier within a plurality of openings in the routing substrate and laterally adjacent to the routing substrate.

5. The packaging method of claim 4, wherein the routing substrate includes the ground structure, and attaching the routing substrate to the carrier includes attaching the ground structure to the carrier.

6. The packaging method of claim 4, further comprising:
exposing the routing substrate terminals and a plurality of ground structure terminals; and
applying solder bumps to the exposed routing substrate terminals and the plurality of ground structure terminals prior to singulating the plurality of packages.

7. The packaging method of claim 1, further comprising depositing a shield layer on top and side surfaces of the molding compound after singulating the plurality of packages.

8. The packaging method of claim 1, further comprising:
reducing a thickness of the molding compound to expose the ground structure prior to removing the carrier; and
forming a top conductive layer over the molding compound and directly on the ground structure prior to removing the carrier.

9. A packaging method comprising:
attaching a ground structure to a carrier;
attaching a plurality of components face down to the carrier and laterally adjacent to the ground structure;
encapsulating the plurality of components within a molding compound;
forming a plurality of trenches in the molding compound to expose the ground structure;
at least partially filling the plurality of trenches with a conductive fill material;
removing the carrier;
exposing a plurality of component terminals and a plurality of ground structure terminals; and
singulating a plurality of packages, each package including a component encapsulated within the molding compound.

10. The packaging method of claim 9, wherein singulating the plurality of packages comprises cutting through the conductive fill material and the ground structure.

11. The packaging method of claim 9, wherein at least partially filling the plurality of trenches with the conductive fill material comprises electrolytic plating a metal cap layer within the plurality of trenches and over the molding compound.

12. The packaging method of claim 9, wherein at least partially filling the plurality of trenches with the conductive fill material comprises filling the plurality of trenches with a conductive paste.

13. The packaging method of claim 12, further comprising forming a top conductive layer over the molding compound and directly on the conductive paste that fills the plurality of trenches prior to removing the carrier.

14. A packaging method comprising:
attaching a ground structure to a carrier;
attaching a plurality of components face down to the carrier and laterally adjacent to the ground structure;
encapsulating the plurality of components within a molding compound;
removing the carrier;
exposing a plurality of component terminals and a plurality of ground structure terminals;
applying solder bumps to the exposed plurality of ground structure terminals; and
cutting through the ground structure and the solder bumps applied to the plurality of ground structure terminals to singluate a plurality of packages, each package including a component encapsulated within the molding compound, wherein singulating the plurality of packages comprises cutting through the ground structure.

15. The packaging method of claim 14, further comprising:
attaching a plurality of die face down to the carrier, wherein each of the plurality of components is taller than each of the plurality of die;
encapsulating the plurality of components, the ground structure, and the plurality of die within the molding compound;
exposing a plurality of die terminals; and
applying solder bumps to the plurality of exposed die terminals prior to singulating the plurality of packages.

16. The packaging method of claim 15, wherein each singulated package includes a bottom surface with a first group of solder bumps directly on a group of die terminals and a second group of solder bumps directly on a group of component terminals.

17. The packaging method of claim 16, wherein a routing is not provided on the bottom surface of the package.

18. The packaging method of claim 17, wherein each of the plurality of components is a passive component.

* * * * *